United States Patent
Kamijo et al.

(10) Patent No.: US 10,381,565 B2
(45) Date of Patent: Aug. 13, 2019

(54) DISPLAY DEVICE

(71) Applicant: Japan Display Inc., Tokyo (JP)

(72) Inventors: Yoichi Kamijo, Tokyo (JP); Shuichi Osawa, Tokyo (JP); Yoshihiro Watanabe, Tokyo (JP); Yoshikatsu Imazeki, Tokyo (JP)

(73) Assignee: Japan Display Inc., Tokyo (JP)

( * ) Notice: Subject to any disclaimer, the term of this patent is extended or adjusted under 35 U.S.C. 154(b) by 154 days.

(21) Appl. No.: 15/660,329

(22) Filed: Jul. 26, 2017

(65) Prior Publication Data

US 2018/0033969 A1 Feb. 1, 2018

(30) Foreign Application Priority Data

Jul. 29, 2016 (JP) ................. 2016-149613

(51) Int. Cl.
| | |
|---|---|
| *G02F 1/1333* | (2006.01) |
| *H01L 51/00* | (2006.01) |
| *H01L 51/50* | (2006.01) |
| *G02F 1/1345* | (2006.01) |
| *H01L 51/52* | (2006.01) |
| *H01L 27/32* | (2006.01) |
| *H01L 51/05* | (2006.01) |

(52) U.S. Cl.
CPC ........ *H01L 51/0023* (2013.01); *G02F 1/1345* (2013.01); *G02F 1/133345* (2013.01); *H01L 27/3276* (2013.01); *H01L 51/0096* (2013.01); *H01L 51/5012* (2013.01); *H01L 51/5246* (2013.01); *G02F 1/133305* (2013.01); *H01L 51/0512* (2013.01); *Y02E 10/549* (2013.01)

(58) Field of Classification Search
CPC combination set(s) only.
See application file for complete search history.

(56) References Cited

U.S. PATENT DOCUMENTS

| | | | | |
|---|---|---|---|---|
| 2008/0151171 | A1* | 6/2008 | Kim ................. | G02F 1/13338 349/150 |
| 2010/0007625 | A1* | 1/2010 | Jiang ................. | G06F 3/0414 345/173 |
| 2010/0277425 | A1* | 11/2010 | Choi ................. | G06F 3/0412 345/173 |
| 2011/0316810 | A1* | 12/2011 | Tsujino ............. | G02F 1/13338 345/174 |
| 2014/0062941 | A1* | 3/2014 | Park ................. | G06F 3/0412 345/174 |

(Continued)

FOREIGN PATENT DOCUMENTS

JP 2009-237410 A 10/2009

*Primary Examiner* — Sang V Nguyen
(74) *Attorney, Agent, or Firm* — K&L Gates LLP

(57) ABSTRACT

According to one embodiment, a display device includes first to third substrates, a display function layer and a first connecting structure. The first substrate includes a first basement and a first conductive layer. The second substrate includes a second basement. The third substrate includes a third basement. The first connecting structure includes a first contact hole which penetrates at least the second basement and a first connecting material which electrically connects the first conductive layer and the second conductive layer to each other via the first contact hole, and electrically connects the first conductive layer and the second conductive layer to each other.

19 Claims, 20 Drawing Sheets

(56) References Cited

U.S. PATENT DOCUMENTS

| | | | | |
|---|---|---|---|---|
| 2014/0132859 A1* | 5/2014 | Yanase | .................. | G06F 3/0412 |
| | | | | 349/12 |
| 2015/0227239 A1* | 8/2015 | Kim | ....................... | G06F 3/044 |
| | | | | 345/174 |
| 2017/0024042 A1* | 1/2017 | Oem | ....................... | G06F 3/044 |
| 2017/0170242 A1* | 6/2017 | Choi | ..................... | H01L 27/323 |
| 2018/0188566 A1* | 7/2018 | Suga | ..................... | G02F 1/1339 |

\* cited by examiner

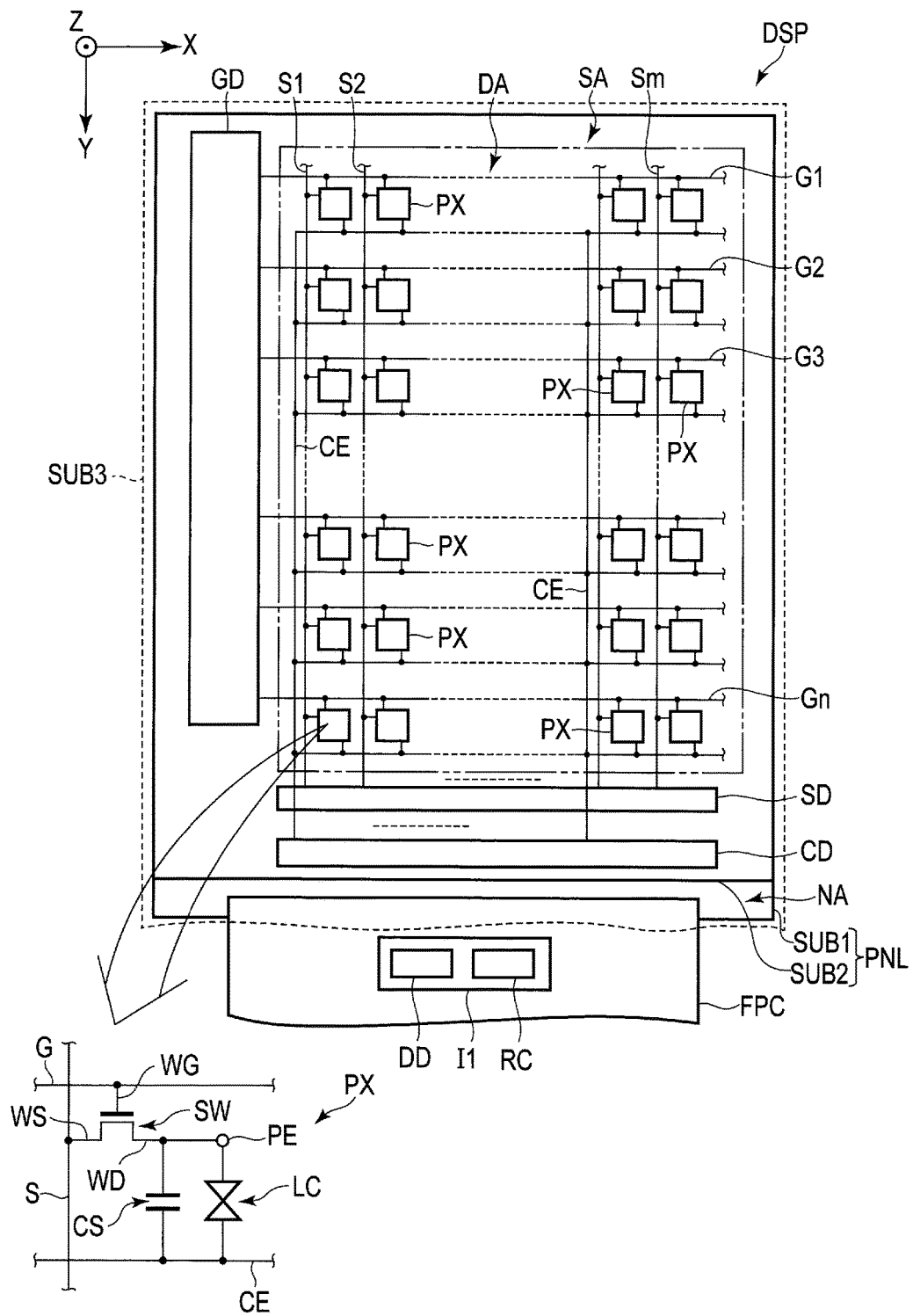
F I G. 2

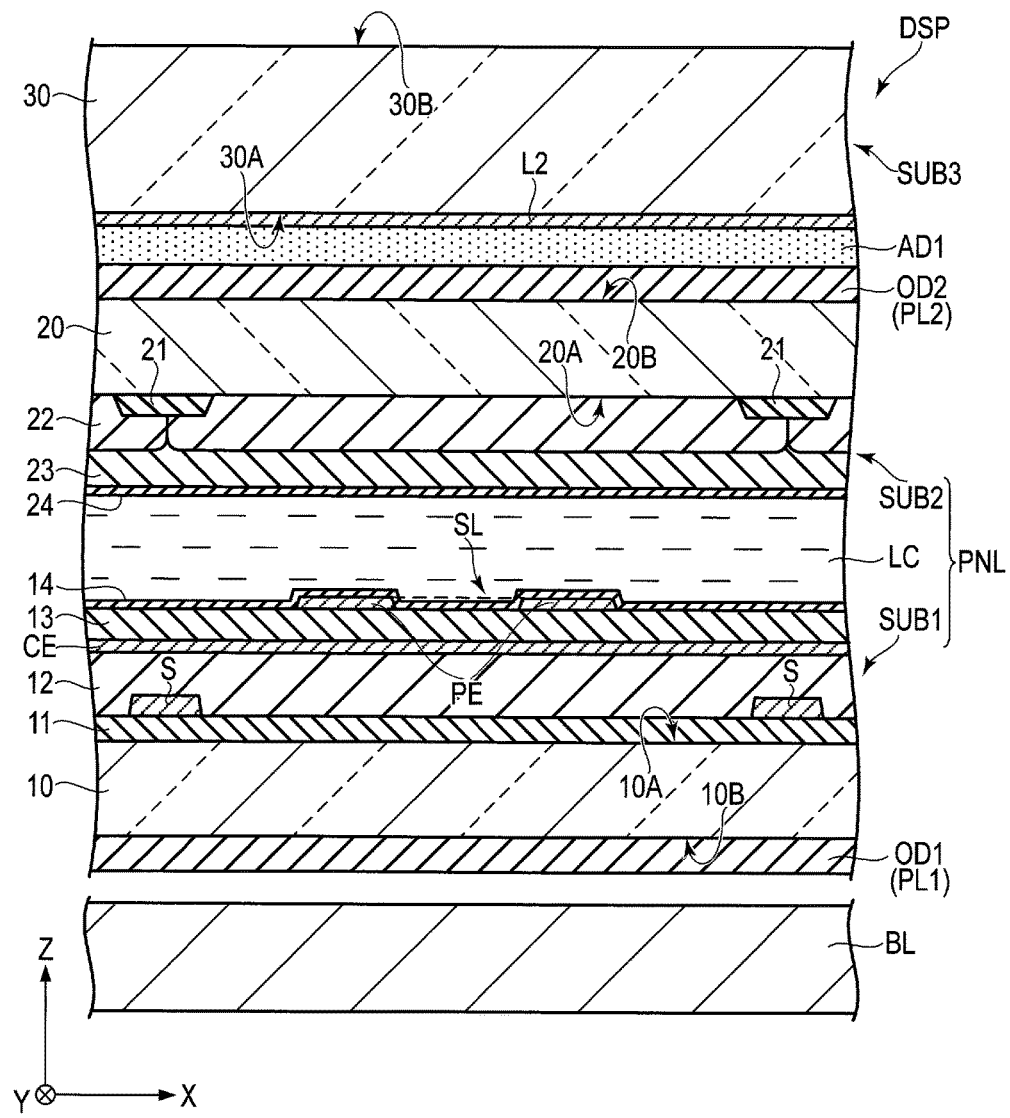
F I G. 3

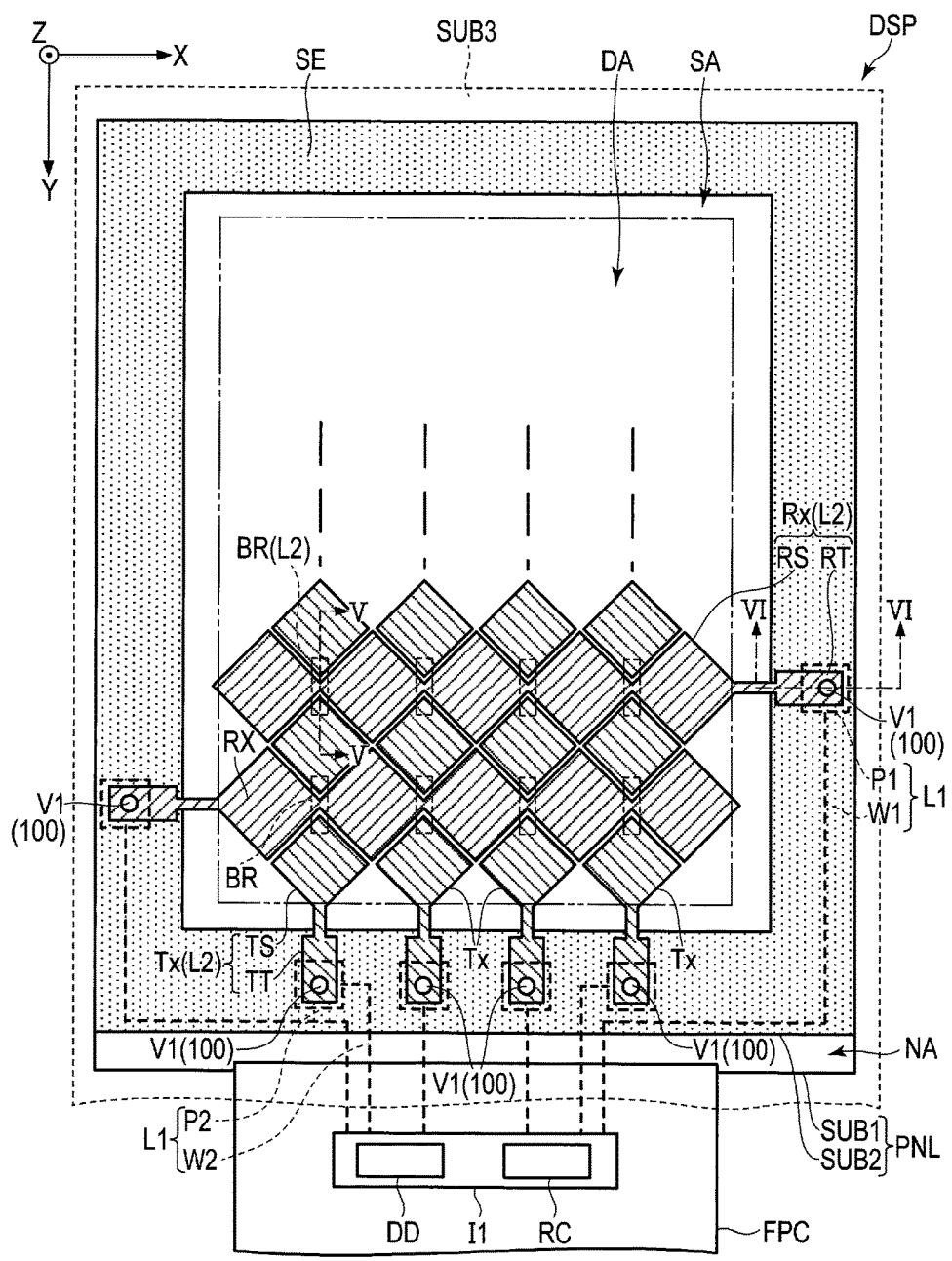
F I G. 4

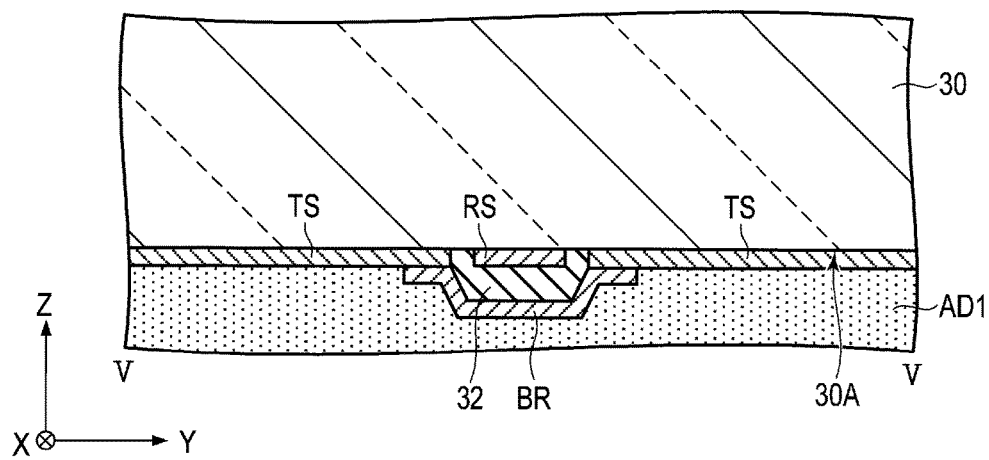
F I G. 5
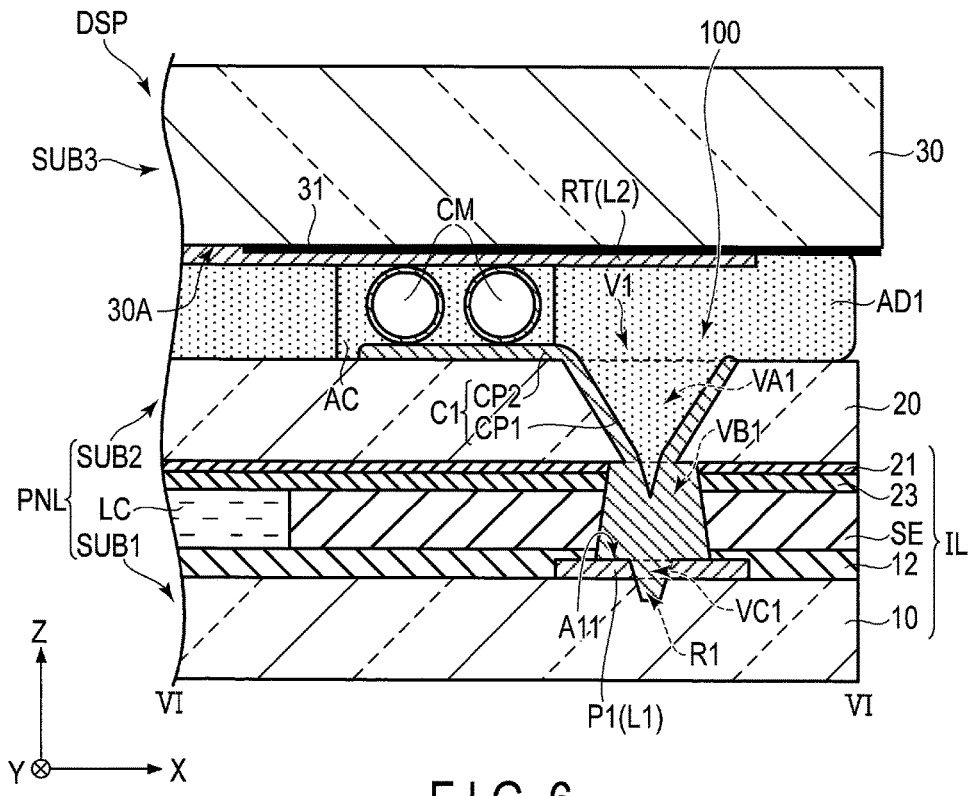
F I G. 6

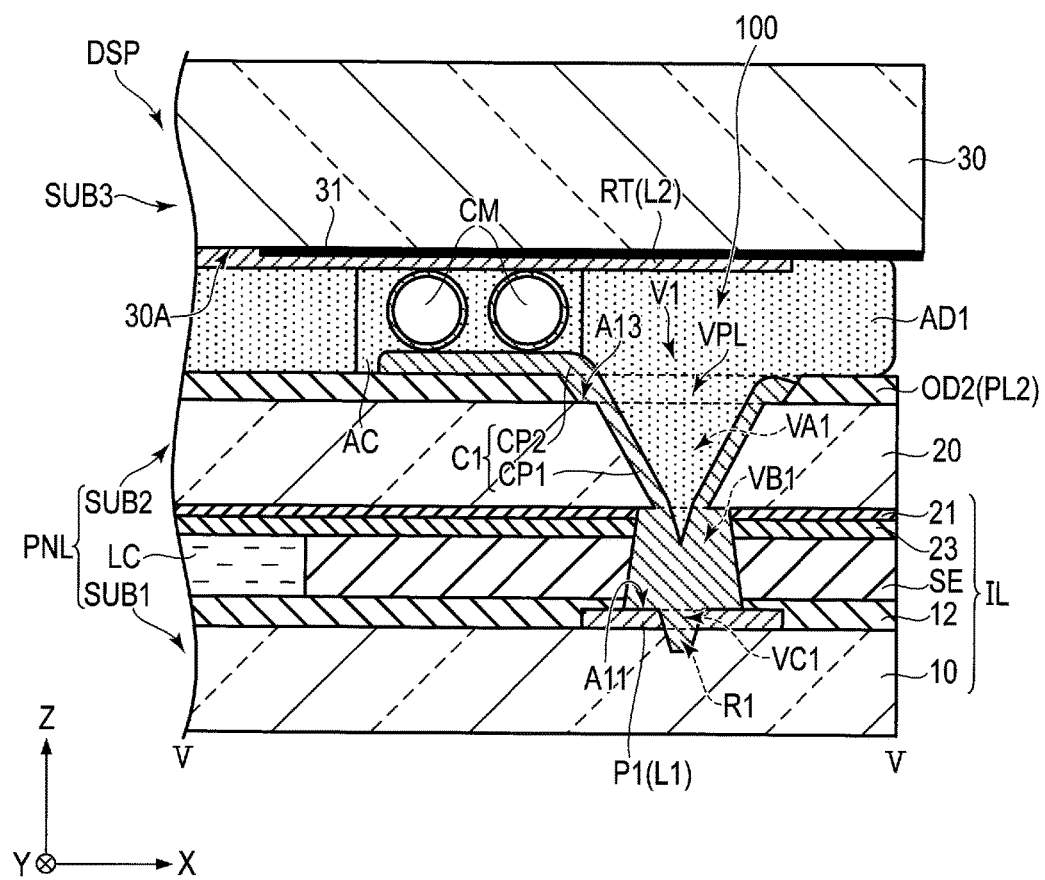
F I G. 7

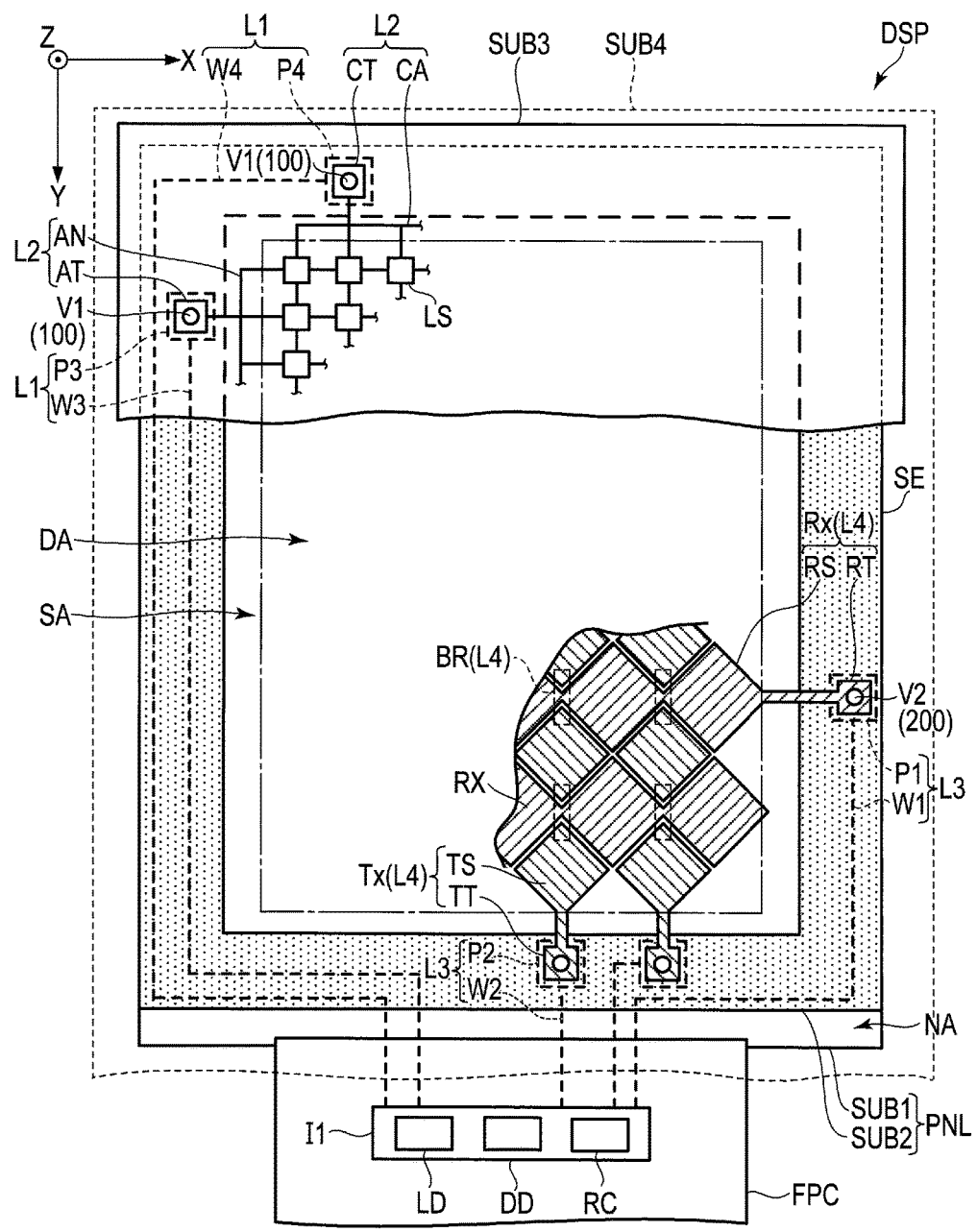
F I G. 10

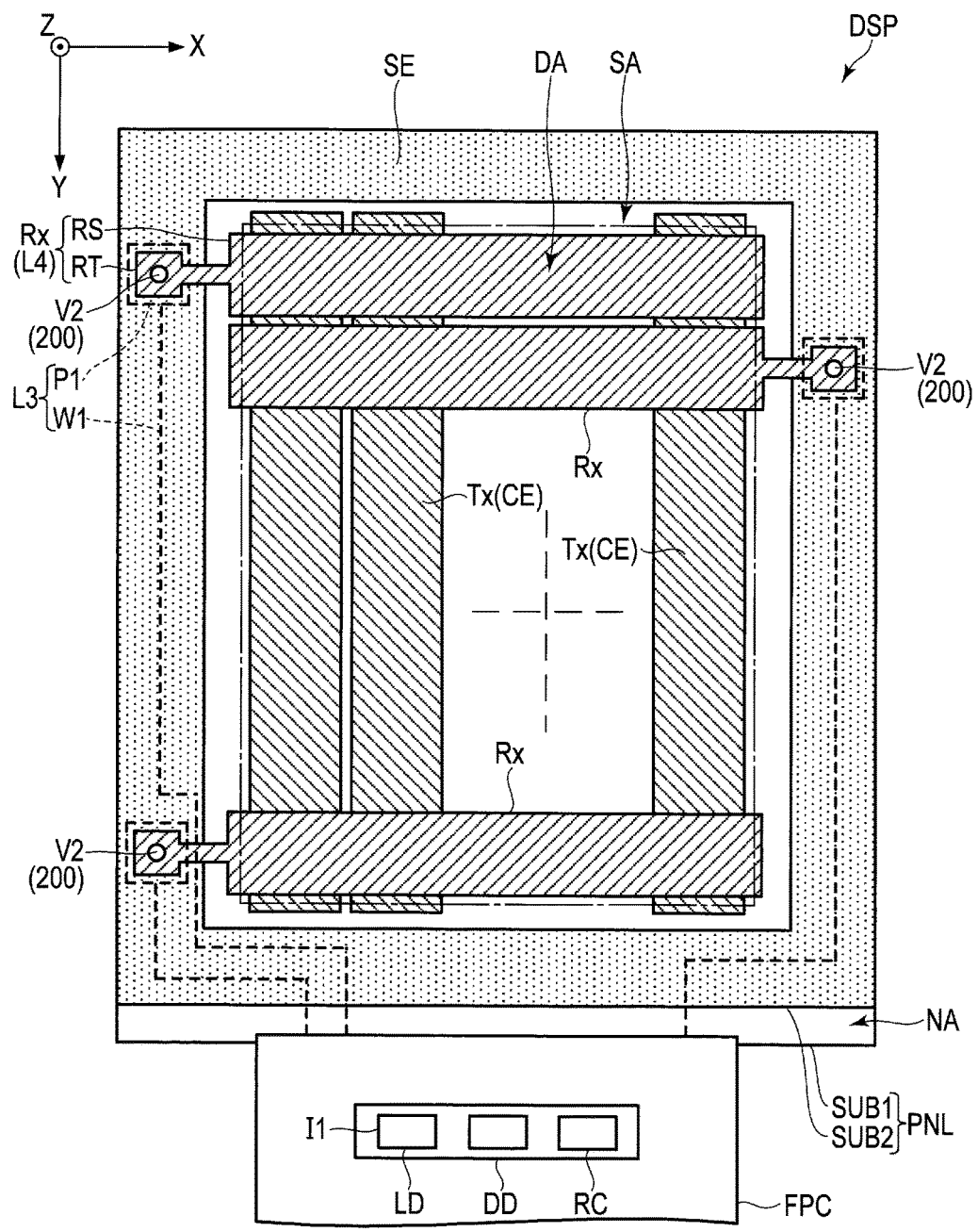
F I G. 11

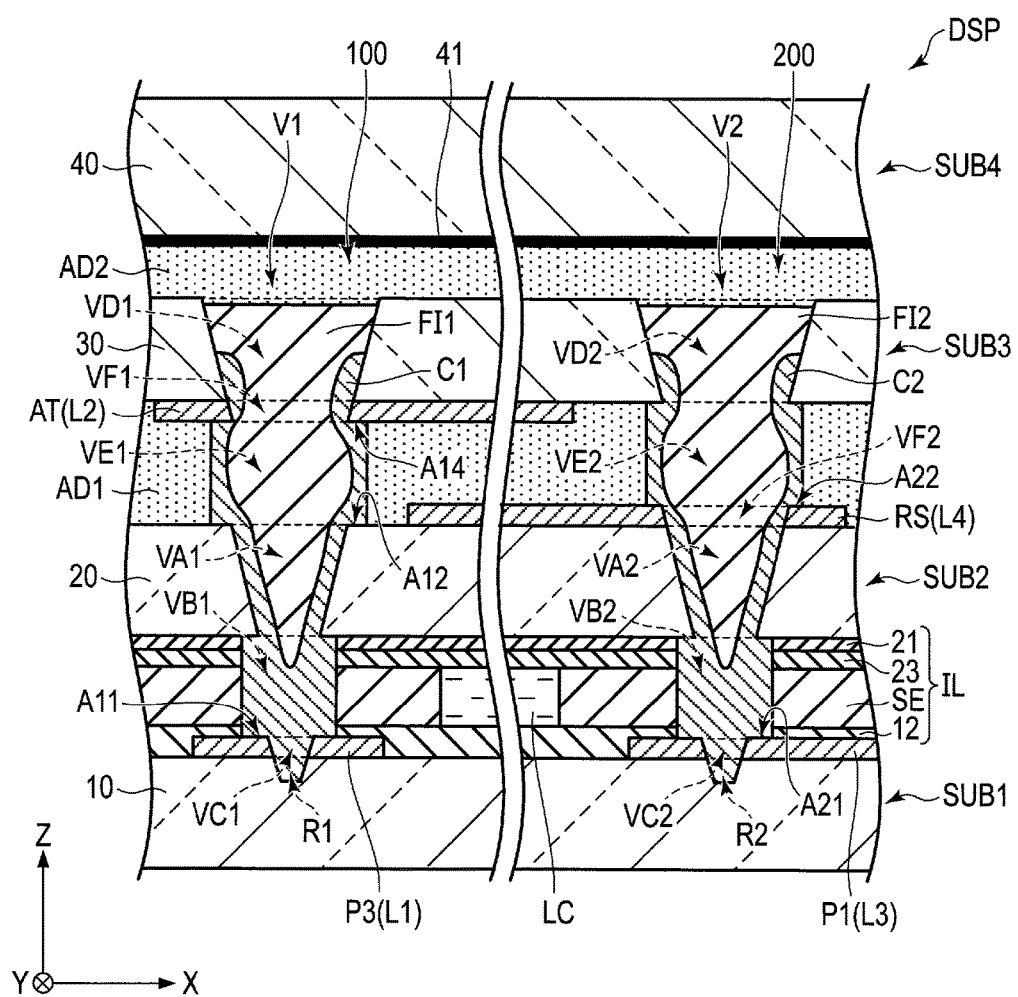
F I G. 13

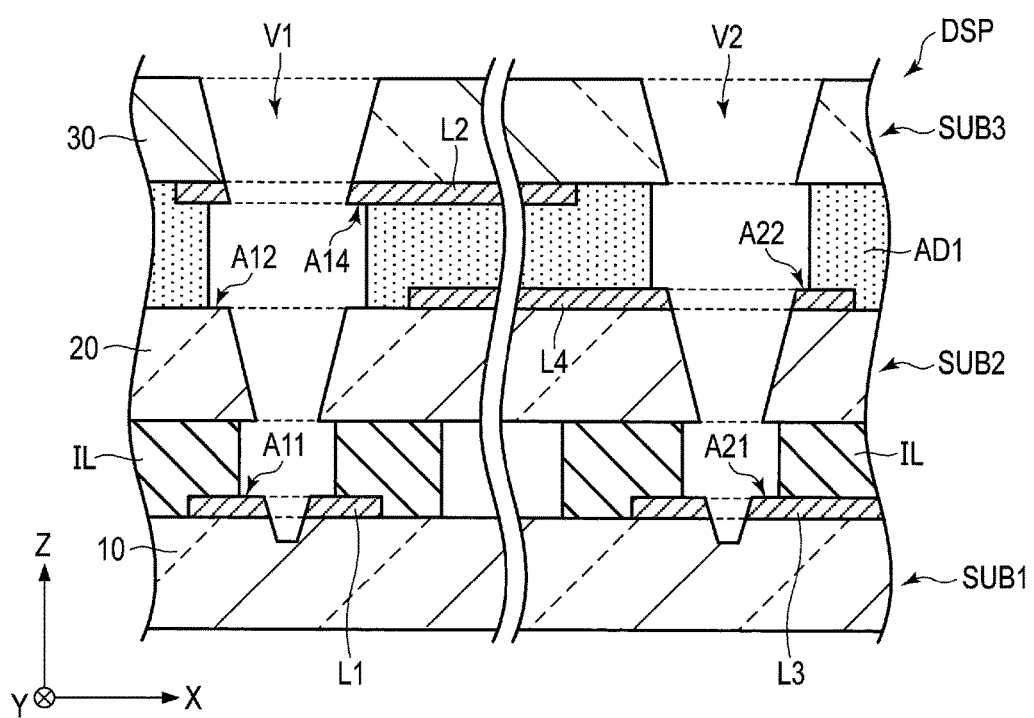
F I G. 15

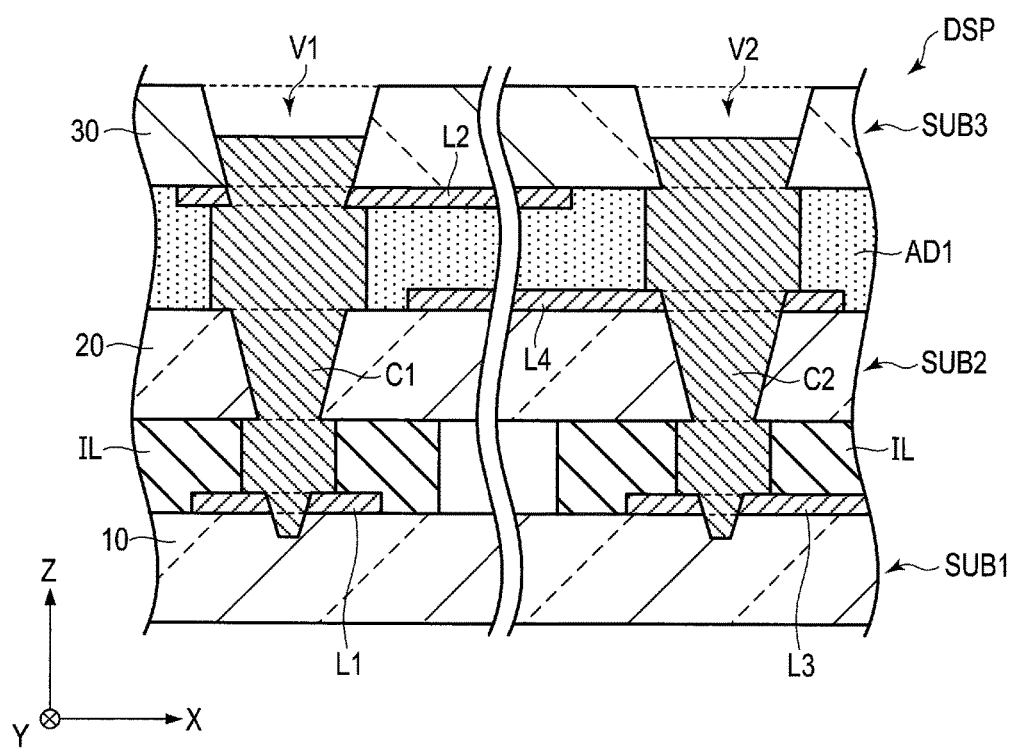
F I G. 16

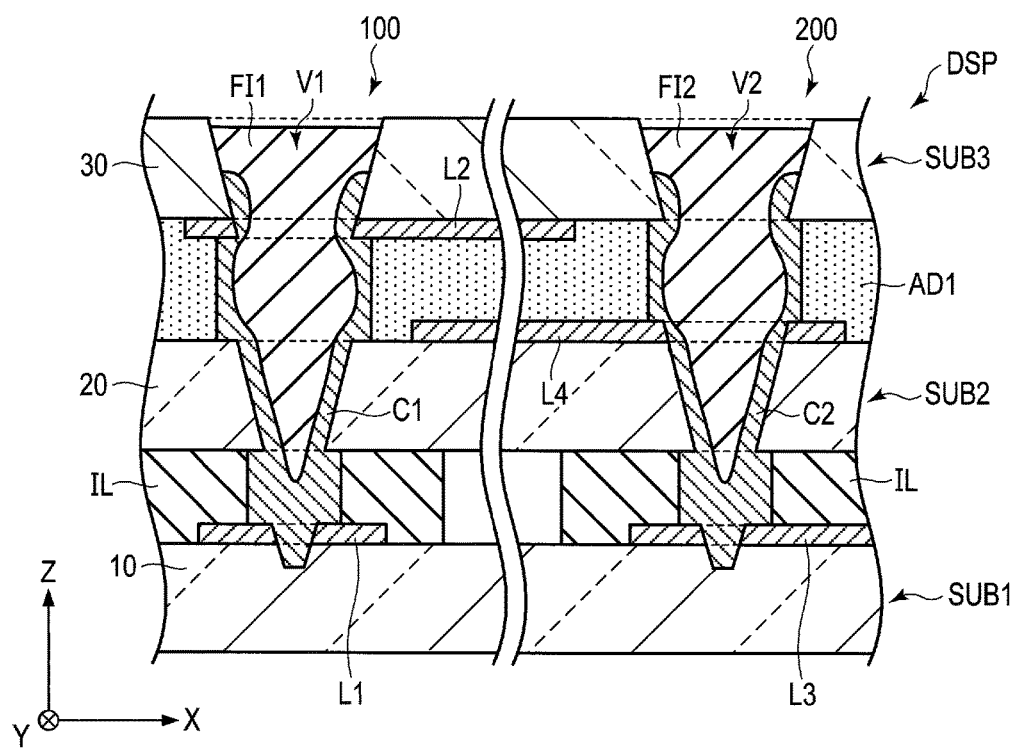
F I G. 17

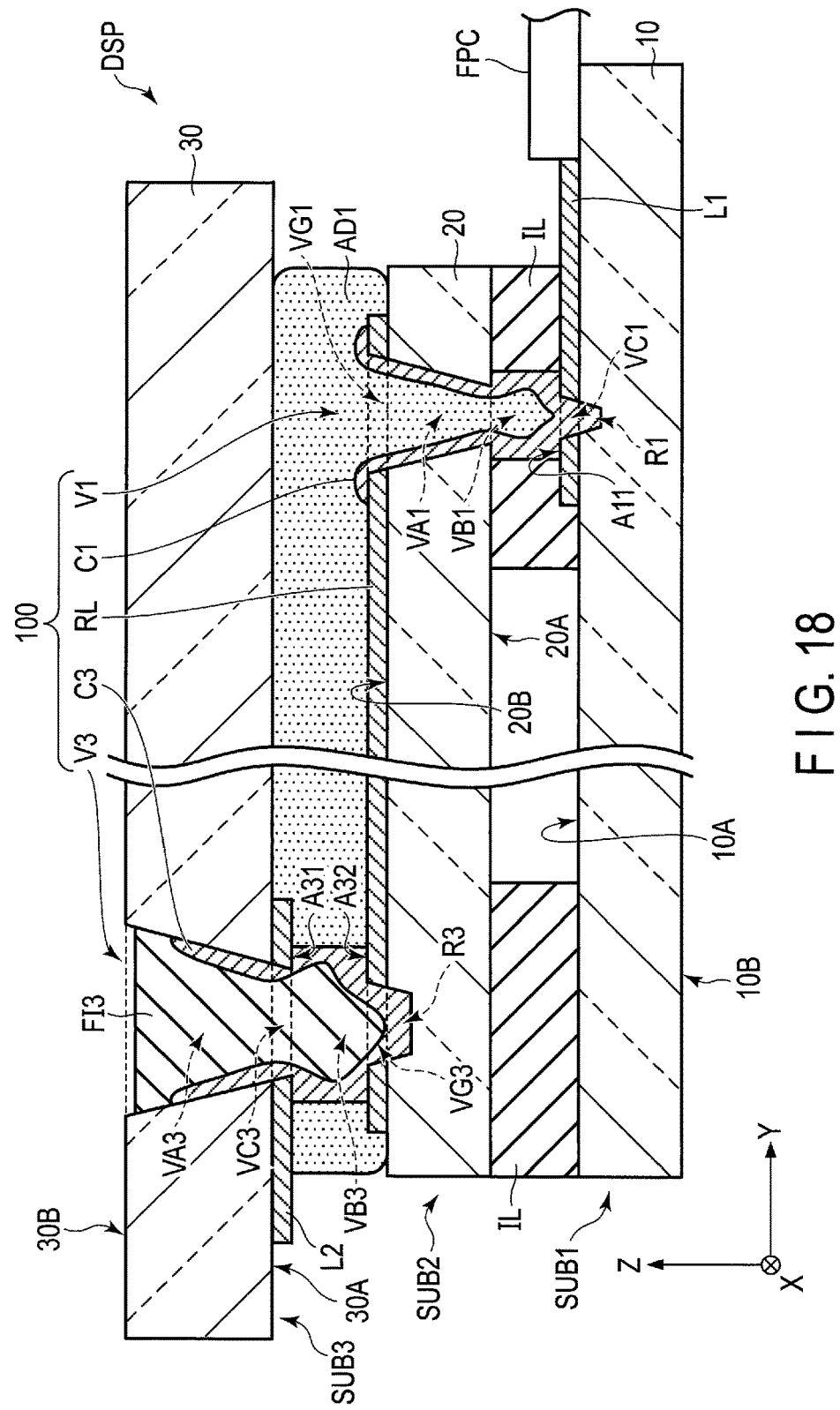
F I G. 18

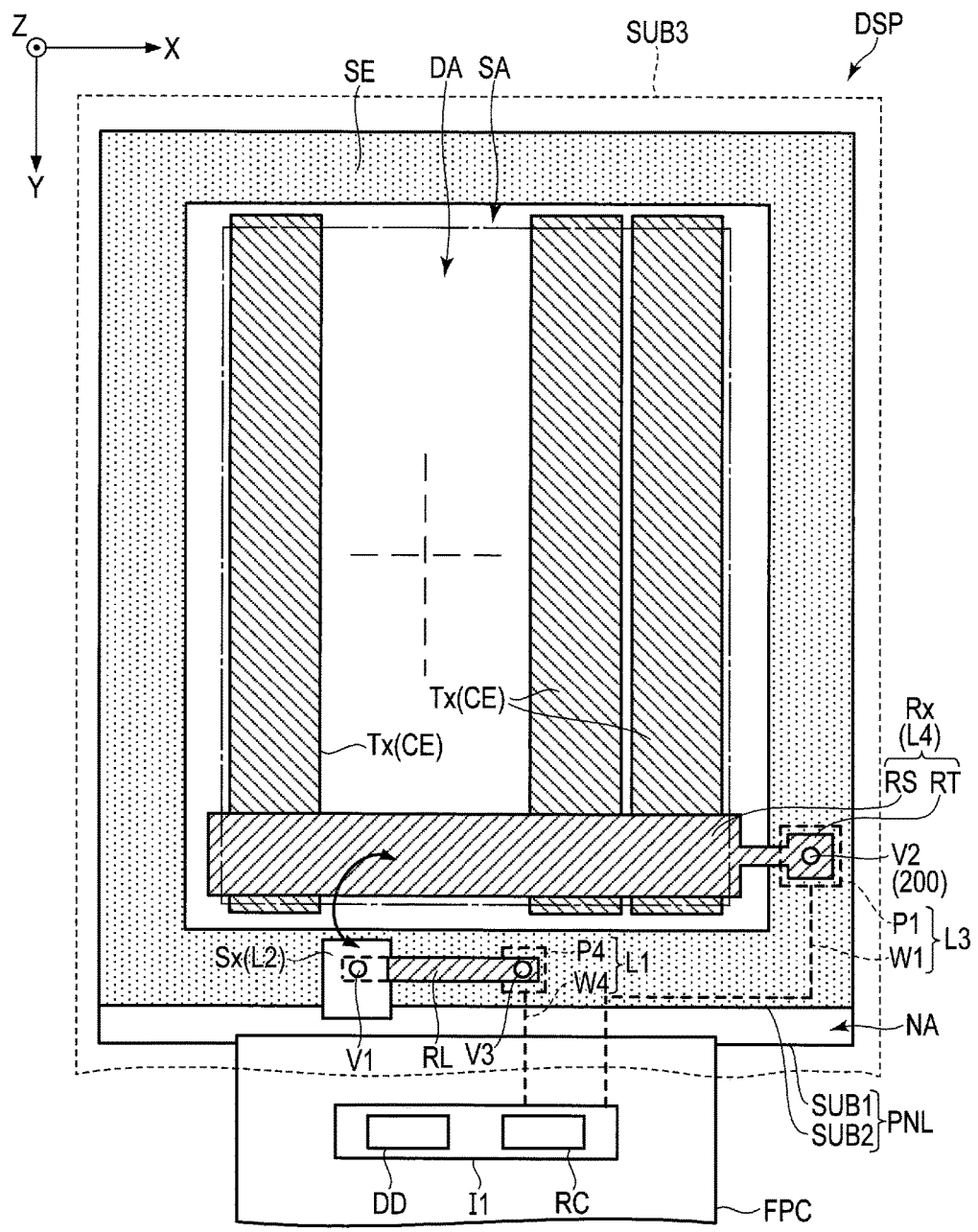
F I G. 19 excellent# DISPLAY DEVICE

CROSS-REFERENCE TO RELATED APPLICATIONS

This application is based upon and claims the benefit of priority from Japanese Patent Application No. 2016-149613, filed Jul. 29, 2016, the entire contents of which are incorporated herein by reference.

FIELD

Embodiments described herein relate generally to a display device.

BACKGROUND

A display device further comprising, in addition to a display panel including a display function layer, another substrate opposed to this display panel is known. Nowadays, the function of the display device is becoming complex, and in some cases, to make the display device perform a specific function, various conductive layers are formed on this substrate. In this display device, it is necessary to make a conductive layer provided on this substrate and a conductive layer included in the display panel electrically continuous with each other.

SUMMARY

The present disclosure relates generally to a display device. According to one embodiment, a display device includes first to third substrates, a display function layer and a first connecting structure. The first substrate includes a first basement and a first conductive layer. The second substrate includes a second basement. The third substrate includes a third basement. The first connecting structure includes a first contact hole which penetrates at least the second basement and a first connecting material which electrically connects the first conductive layer and the second conductive layer to each other via the first contact hole, and electrically connects the first conductive layer and the second conductive layer to each other. Additional features and advantages are described herein, and will be apparent from the following Detailed Description and the figures.

BRIEF DESCRIPTION OF THE DRAWINGS

FIG. 2 is a plan view showing an example of a display device adopting the structure shown in FIG. 1.

FIG. 3 is a sectional view schematically showing a display area of the display device shown in FIG. 2.

FIG. 4 is a plan view showing each conductive layer and a first contact hole of the display device shown in FIG. 2.

FIG. 5 is a sectional view of the display device taken along line V-V of FIG. 4.

FIG. 6 is a sectional view of the display device taken along line VI-VI of FIG. 4.

FIG. 7 is a sectional view showing a modification of the display device shown in FIG. 6.

FIG. 10 is a plan view showing an example of a display device adopting the structure shown in FIG. 9.

FIG. 11 is a plan view showing another structural example of a sensor provided in a display device.

FIG. 13 is a sectional view of the display device in the vicinity of a first connecting structure and a second connecting structure shown in FIG. 10.

FIG. 15 is a section view showing an example of the manufacturing method of the display device.

FIG. 16 is a section view showing an example of the manufacturing method of the display device.

FIG. 17 is a sectional view showing an example of the manufacturing method of the display device.

FIG. 18 is a sectional view showing a structural example of a display device of a third embodiment.

FIG. 19 is a plan view showing an example of a display device adopting the structure shown in FIG. 18.

DETAILED DESCRIPTION

Figure 1:
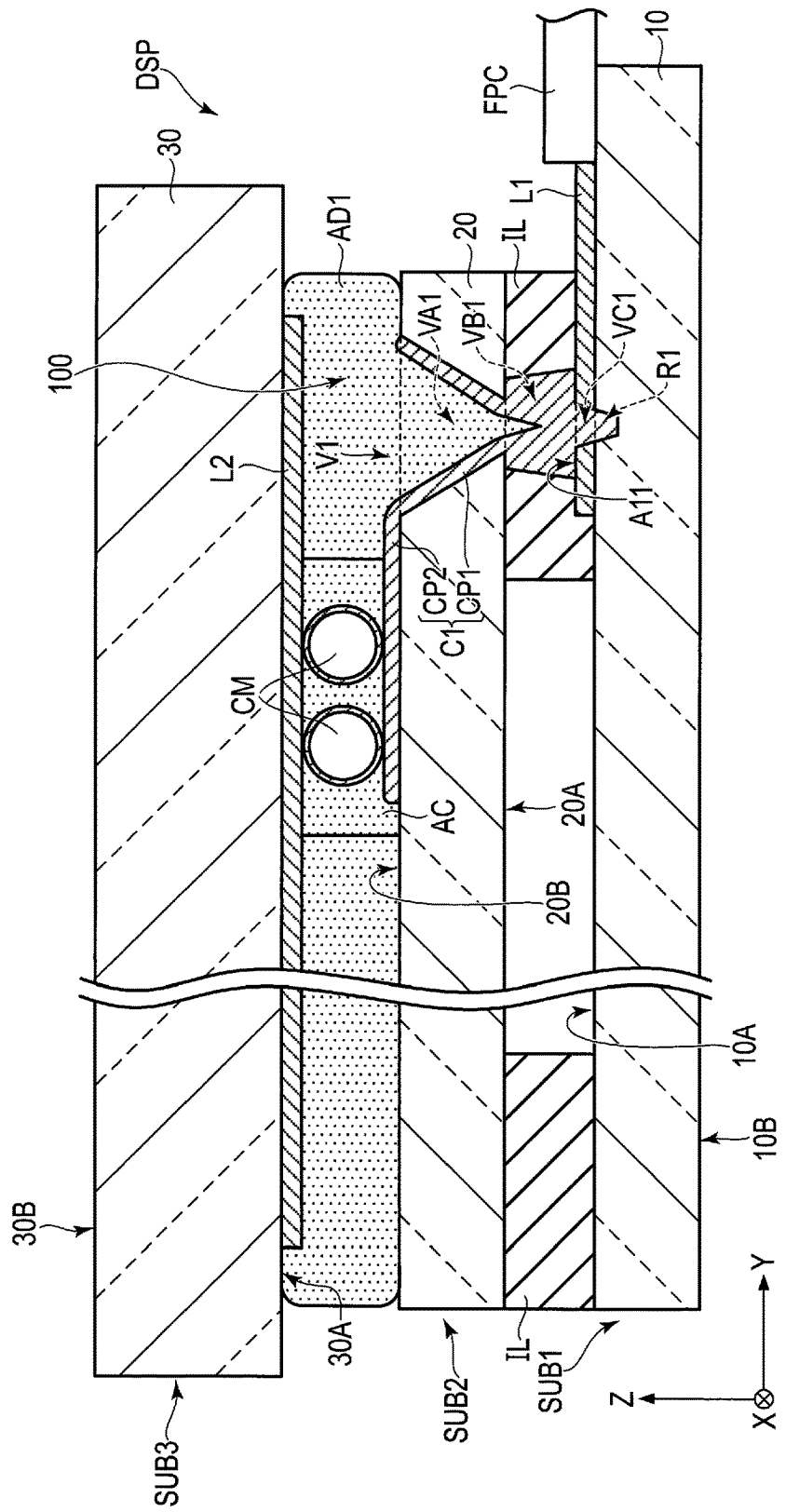
FIG. 1 is a sectional view showing a structural example of a display device of a first embodiment.

In general, according to one embodiment, a display device includes a first substrate, a second substrate, a third substrate, a display function layer and a first connecting structure. The first substrate includes a first basement and a first conductive layer. The second substrate includes a second basement including a first surface opposed to the first substrate and a second surface opposite to the first substrate. The third substrate includes a third basement opposed to the second surface of the second substrate, and a second conductive layer. The display function layer is arranged between the first substrate and the second substrate. The first connecting structure includes a first contact hole which penetrates at least the second basement, and a first connecting material which electrically connects the first conductive layer and the second conductive layer to each other via the first contact hole, and the first connecting structure electrically connects the first conductive layer and the second conductive layer to each other.

According to this structure, it is possible to provide a display device which can make conductive layers provided respectively on a plurality of substrates electrically continuous with each other and can also achieve cost reduction or space saving.

Embodiments will be described with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

A display device disclosed in each embodiment can be used in various devices such as a smartphone, a tablet computer, a mobile phone, a notebook computer, an in-car device, and a game console. The main structure described in each embodiment is also applicable to various display devices such as a liquid crystal display device, a self-luminous display device such as an organic electroluminescent display device, an electronic paper display device comprising an electrophoresis element, etc., a display device adopting micro-electromechanical systems (MEMS), and a display device adopting electrochromism. Further, a connecting structure disclosed in each embodiment is applicable not only to a display device but also to an electronic device comprising a plurality of substrates.

First Embodiment

FIG. 1 is a sectional view showing a structural example of a display device DSP of a first embodiment. A first direction X, a second direction Y, and a third direction Z orthogonally cross each other but may also cross each other at any angle other than an angle of 90 degrees. The first direction X and the second direction Y correspond to the directions parallel to the surfaces of substrates which constitute the display device DSP, and the third direction Z corresponds to the thickness direction of the display device DSP. Here, the drawing shows a cross-section of a part of the display device DSP in a Y-Z plane defined by the second direction Y and the third direction Z.

The display device DSP includes a first substrate SUB1, a second substrate SUB2, a third substrate SUB3, an insulating layer IL, a first adhesive layer AD1, and a flexible printed circuit FPC. The first substrate SUB1 and the second substrate SUB2 are opposed to each other in the third direction Z. In the following explanation, a direction from the first substrate SUB1 toward the second substrate SUB2 is referred to as upward (or merely above), and a direction from the second substrate SUB2 toward the first substrate SUB1 is referred to as downward (or merely below). Further, a view from the second substrate SUB2 toward the first substrate SUB1 is referred to as a plan view. Further, a sectional view of the display device DSP in the Y-Z plane (or an X-Z plane defined by the first direction X and the third direction Z) of FIG. 1 is referred to as a sectional view.

The insulating layer IL is arranged between the first substrate SUB1 and the second substrate SUB2. The insulating layer IL is composed of, for example, one or several organic insulating layers. Note that the insulating layer IL may include an inorganic insulating layer and another conductive layer. Further, in place of the insulating layer IL, an air layer may be provided.

The second substrate SUB2 and the third substrate SUB3 are opposed to each other in the third direction Z and attached to each other via the first adhesive layer AD1. That is, the second substrate SUB2 is arranged between the first substrate SUB1 and the third substrate SUB3.

The first substrate SUB1 includes a first basement 10 and a first conductive layer L1. The first basement 10 has a first surface 10A opposed to the second substrate SUB2, and a second surface 10B opposite to the first surface 10A. In the example illustrated, the first conductive layer L1 is located between the first surface 10A and the second substrate SUB2. For example, the first conductive layer L1 is formed on the first surface 10A, and one part is covered with the insulating layer IL and the other part is extended in such a direction that the other part will not be opposed to the second substrate SUB2. Note that various insulating layers and various conductive layers may be arranged between the first basement 10 and the first conductive layer L1.

The second substrate SUB2 includes a second basement 20. The second basement 20 has a first surface 20A opposed to the first substrate SUB1, and a second surface 20B opposite to the first surface 20A. In second basement 20, the first surface 20A is opposed to the first conductive layer L1 and is spaced apart from the first conductive layer L1 in the third direction Z.

The third basement SUB3 includes a third basement 30 and a second conductive layer L2. The third basement 30 has a first surface 30A opposed to the second substrate SUB2, and a second surface 30B opposite to the first surface 30A. In the example illustrated, the second conductive layer L2 is arranged between the first surface 30A and the second substrate SUB2. For example, the second conductive layer L2 is formed on the first surface 30A and is covered with the first adhesive layer AD1. Note that various insulating layers and various conductive layers may be arranged between the third basement 30 and the second conductive layer L2.

In the present embodiment, each of the basements 10, 20 and 30 is, for example, a glass substrate formed of alkali-free glass, etc. Each of the basements 10, 20 and 30 may also be a resin substrate formed of polyimide, etc. The first conductive layer L1 and the second conductive layer L2 may be formed of a metal material such as molybdenum, tungsten, titanium, aluminum, silver, copper or chromium, an alloy of these metal materials, a transparent conductive material such as indium tin oxide (ITO) or indium zinc oxide (IZO), etc. The first conductive layer L1 and the second conductive layer L2 may have a single-layer structure or may have a multilayer structure.

The flexible printed circuit FPC is mounted on the first substrate SUB1 and is electrically connected to the first conductive layer L1. The flexible printed circuit FPC is connected, for example, to a control board of an electronic device to be equipped with the display device DSP, etc.

The display device DSP includes a first connecting structure 100 which connects the first conductive layer L1 and the second conductive layer L2 to each other. In the present embodiment, the first connecting structure 100 includes a first contact hole V1, a first connecting material C1, and an anisotropic conductive layer AC.

The first contact hole V1 includes a hole VA1 which penetrates the second basement 20, a hole VB1 which penetrates the insulating layer IL, a hole VC1 which penetrates the first conductive layer L1, and a recess R1 which is formed on the first surface 10A of the first basement 10. The centers of the holes VA1 VB1 and VC1 and the recess R1 are located on the same straight line which extends in the third direction Z, and the holes VA1 VB1 and VC1 and the recess R1 communicate with each other. Each of the holes VA1 VB1 and VC1 and the recess R1 is, for example, a perfect circle in a plan view but may be an ellipse or in various other shapes.

The recess R1 is formed from the first surface 10A toward the second surface 10B, but in the example illustrated, the recess R1 does not penetrate through up to the second surface 10B. For example, the depth of the recess R1 in the third direction Z is about $1/5$ to $1/2$ of the thickness of the first basement 10 in the third direction Z. Note that, in place of the recess R1, the first basement 10 may have a hole which penetrates through between the first surface 10A and the second surface 10B.

In the example shown in FIG. 1, the hole VA1 has such a tapered shape that the width (inner diameter) gradually decreases from the second surface 20B toward the first surface 20A. Similarly, the hole VC1 and the recess R1 have such a tapered shape that the width gradually decreases toward the lower end. Further, the hole VB1 has such a tapered shape that the width (inner diameter) gradually increases from the first surface 20A toward the first surface 10A. In the example shown in FIG. 1, the inner surfaces of the holes VA1, VB1 and VC1 and the recess R1 in a sectional view are linear, but these inner surfaces may also be curved.

Further, the hole VA1 may have such a tapered shape that the width increases from the second surface 20B toward the first surface 20A. Similarly, the hole VC1 and the recess R1 may have such a tapered shape that the width gradually increases toward the lower end. Further, the hole VB1 may have such a tapered shape that the width gradually decreases from the first surface 20A toward the first surface 10A. Still further, the holes VA1, VB1 and VC1 and the recess R1 may have such a shape that the width is constant (the inner surface is parallel to the third direction Z).

In the vicinity of the boundary between the hole VA1 and the hole VB1, the width of the hole VB1 is greater than the width of the hole VA1. Further, in the vicinity of the boundary between the hole VB1 and the hole VC1, the width of the hole VB1 is greater than the width of the hole VC1. In this way, the first conductive layer L1 has an area A11 (first area) exposed from the insulating layer IL in the circumference of the hole VC1. For example, the area A11 in a plan view has the shape of a ring which completely surrounds the circumference of the hole VC1. Note that the area A11 may be provided in a part of the circumference of the hole VC1 or may be provided intermittently around the circumference of the hole VC1.

For example, the holes VA1, VB1 and VC1 and the recess R1 can be collectively formed by applying laser light from the second surface 20B side in a state where the third substrate SUB3 and the first adhesive layer AD1 are not arranged. The holes VA1, VB1 and VC1 and the recess R1 may also be formed by etching or various other processes.

The first connecting material C1 includes a first portion CP1 arranged inside the first contact hole V1, and a second portion CP2 arranged outside the first contact hole V1. The first portion CP1 covers the inner surfaces of the holes VA1, VB1 and VC1 and the recess R1. The second portion CP2 covers the second surface 20B. Various insulating layers and conductive layers may be interposed between the second portion CP2 and the second surface 20B.

The first connecting material C1 contains a metal material such as silver. For example, the first connecting material C1 should preferably contain metal fine particles having a particle diameter of the order of magnitude of several nanometers to several tens of nanometers. It is possible to form this first connecting material C1 by injecting the connecting material C1 mixed with a solvent into the hole VA1 and then removing the solvent from the hole VA1 under an environment of atmospheric pressure or pressure less than atmospheric pressure (including vacuum).

The first portion CP1 is in contact with the inner surface of the hole VC1 and the area A11. When the first portion CP1 is in contact with the first conductive layer L1 also in the area A11, as compared to the case of being in contact only with the inner surface, the contact area can be increased, and consequently the reliability of electrical connection improves.

In the example shown in FIG. 1, the first portion CP1 has a hollow inside the first contact hole V1. The hollow is filled with the first adhesive layer AD1. Note that the hollow may be filled with an insulating or conductive filling material.

The second portion CP2 is opposed to the second conductive layer L2. In an area where the second portion CP2 and the second conductive layer L2 are opposed to each other, the above-described anisotropic conductive layer AC is formed between the second portion CP2 and the second conductive layer L2. The anisotropic conductive layer AC includes a plurality of conductive materials CM. As the conductive material CM, for example, a ball-shaped elastic resin which is plated with a conductive material such as gold may be used. The second conductive layer L2 and the second portion CP2 of the first connecting material C1 are electrically connected to each other via the conductive material CM. Note that the anisotropic conductive layer AC may be further provided between the first portion CP1 and the second conductive layer L2.

It is possible to form the anisotropic conductive layer AC by, for example, attaching a tape including the conductive material CM to either the second portion CP2 of the first conductive material C1 or the second conductive layer L2, or applying a resin including the conductive material CM to either the second portion CP2 or the second conductive layer L2. Even if a resin is provided as the base of the first adhesive layer AD1 on the tape or the resin, under pressure caused at the time of attachment of the second substrate SUB2 and the third substrate SUB3, the conductive material CM projects from the first adhesive layer AD, and therefore the second portion CP2 and the second conductive layer L2 can be electrically continuous with each other.

In the above-described structure, the second conductive layer L2 is electrically connected to the flexible printed circuit FPC via the first connecting material C1 and the first conductive layer L1. Therefore, a control circuit which writes a signal to the second conductive layer L2 and reads a signal output from the second conductive layer L2 can be connected to the second conductive layer L2 via the flexible printed circuit FPC. That is, to connect the second conductive layer L2 and the control circuit to each other, there is no need to mount another circuit board on the third substrate SUB3.

Further, neither a terminal for mounting this circuit board nor a routing wire for connecting the second conductive layer L2 to this circuit board will be required. Accordingly, the costs and spaces for the circuit board, terminal and routing wire which are considered unnecessary can be reduced in the present embodiment.

Next, an example of a liquid crystal display device adopting the structure shown in FIG. 1 will be described.

FIG. 2 is a plan view showing a structural example of the display device DSP. The display device DSP includes a display panel PNL including the first substrate SUB1 and the second substrate SUB2, the third substrate SUB3, the flexible printed circuit FPC, and an IC chip I1. Here, the third substrate SUB3 is shown by dashed lines. The first substrate SUB1 is an array substrate, and the second substrate SUB2 is a counter-substrate opposed to the array substrate. The third substrate SUB3 is a cover member (which is referred to also as a cover glass, a cover lens, etc.) which forms the outermost surface of the display device DSP.

The display device DSP includes a display area DA which displays an image, and a frame-shaped surrounding area SA which surrounds the display area DA. The display area DA and the surrounding area SA correspond to an area where these substrates SUB1 and SUB2 are opposed to each other.

In the example shown in FIG. 2, the display device DSP includes an unopposed area NA where the first substrate SUB1 is not opposed to the second substrate SUB2.

The flexible printed circuit FPC is connected to the first substrate SUB1 in the unopposed area NA. The IC chip I1 is mounted on the flexible printed circuit FPC. Note that the IC chip I1 may be mounted on the unopposed area NA or may be mounted on an external circuit board which is connected to the flexible printed circuit FPC. In the IC chip I1, for example, a display driver DD which outputs a signal necessary for image display, and a detection circuit RC which functions as a touch panel controller are incorporated. Note that the detection circuit RC may be incorporated in an IC chip other than the IC chip I1.

The display device DSP includes a plurality of pixels PX in the display area DA. Here, the pixel corresponds to a minimum unit which is individually controllable according to a pixel signal. The pixels PX are arranged in a matrix in the first direction X and the second direction Y.

Further, the display device DSP includes a plurality of scanning lines G (G1 to Gn), a plurality of signal lines (S1 to Sm), a common electrode CE, etc., in the display area DA. The scanning lines G extend in the first direction X and are arranged in the second direction Y. The signal lines S extend in the second direction Y and are arranged in the first direction X. Note that the scanning line G and the signal line S may not extend linearly but may be partially bent. The common electrode CE is provided across the pixels PX. The scanning line G, the signal line S, and the common electrode CE are drawn to the surrounding area SA. In the surrounding area SA, the scanning line G is connected to a scanning line drive circuit GD, the signal line S is connected to a signal line drive circuit SD, and the common electrode CE is connected to a common electrode drive circuit CD. The scanning line drive circuit GD, the signal line drive circuit SD and the common electrode drive circuit CD may be formed on the first substrate SUB1 or may be partially or entirely incorporated in the display driver DD.

Each pixel PX includes a switching element SW, a pixel electrode PE, the common electrode CE, a liquid crystal layer LC, etc. The liquid crystal layer LC is disposed between the first substrate SUB1 and the second substrate SUB2 and corresponds to the display function layer in the present embodiment. The switching element SW is formed of, for example, a thin-film transistor (TFT) and is electrically connected to the scanning line G and the signal line S. More specifically, the switching element SW includes a gate electrode WG, a source electrode WS and a drain electrode WD. The gate electrode WG is electrically connected to the scanning line G. In the example illustrated, an electrode electrically connected to the signal line S is referred to as the source electrode WS, and an electrode electrically connected to the pixel electrode PE is referred to as the drain electrode WD.

The scanning line G is connected to the switching element SW of each of the pixels PX which are arranged in the first direction X. The signal line S is connected to the switching element SW of each the pixels PX which are arranged in the second direction Y. Each pixel electrode PE is opposed to the common electrode CE, and drives the liquid crystal layer LC by an electric field to be produced between the pixel electrode PE and the common electrode CE. A storage capacitor CS which holds a pixel potential is formed, for example, between the common electrode CE and the pixel electrode PE.

FIG. 3 is a sectional view schematically showing a part of the display device DSP in the display area DA. Here, the drawing shows a cross-section of the display device DSP taken along the first direction X. The illustrated display device DSP has a structure conforming to a display mode mainly using a lateral electric field which is substantially parallel to a substrate surface. Note that the display device DSP may have a structure conforming to a display mode using a longitudinal electric field which is perpendicular to a substrate surface, an electric field which is oblique to a substrate surface or a combination thereof. In the display mode using the lateral electric field, for example, it is possible to adopt such a structure where either the first substrate SUB1 or the second substrate SUB2 includes both the pixel electrode PE and the common electrode CE. In the display mode using the longitudinal electric field or the oblique electric field, for example, it is possible to adopt such a structure where the first substrate SUB1 includes one of the pixel electrode PE and the common electrode CE, and the second substrate SUB2 includes the other of the pixel electrode PE and the common electrode CE. Note that the substrate surface here is a surface parallel to the X-Y plane.

The first substrate SUB1 includes the first basement 10, the signal line S, the common electrode CE, the pixel electrode PE, a first insulating layer 11, a second insulating layer 12, a third insulating layer 13, a first alignment film 14, etc. Here, the above-described switching element SW and scanning line G, various intervening insulating layers, and the like are not illustrated.

The first insulating layer 11 is provided above the first surface 10A. The signal line S is provided above the first insulating layer 11. The second insulating layer 12 is provided above the signal line S and the first insulating layer 11. The common electrode CE is provided above the second insulating layer 12. The third insulating layer 13 is provided above the common electrode CE. The pixel electrode PE is provided above the third insulating layer 13. The pixel electrode PE is opposed to the common electrode CE via the third insulating layer 13. In the example shown in FIG. 3, the pixel electrode PE has one slit SL. Note that the pixel electrode PE may have more than one slit SL or may not have any slit SL at all. The first alignment film 14 covers the pixel electrode PE and the third insulating layer 13.

The scanning line G and the signal line S may be formed of a metal material such as molybdenum, tungsten, titanium, or aluminum, and may have a single-layer structure or may have a multilayer structure. The common electrode CE and the pixel electrode PE may be formed of, for example, a transparent conductive material such as indium tin oxide (ITO) or indium zinc oxide (IZO). For example, the first insulating layer 11 and the third insulating layer 13 are inorganic insulating layers, and the second insulating layer 12 is an organic insulating layer.

The structure of the first substrate SUB1 is not limited to the example shown in the drawing, and the pixel electrode PE may be located between the second insulating layer 12 and the third insulating layer 13, and the common electrode CE may be located between the third insulating layer 13 and the first alignment film 14. Further, both the pixel electrode PE and the common electrode CE may have the shape of a comb and may be disposed in the same layer in such a manner as to be engaged with each other.

The second substrate SUB2 includes the second basement 20, a light-shielding layer 21, a color filter 22, an overcoat layer 23, a second alignment film 24, etc.

The light-shielding layer 21 and the color filter 22 are provided below the first surface 20A. The light-shielding layer 21 delimits the pixels and is located directly above the signal lines S. The color filter 22 is opposed to the pixel electrode PE and partially overlaps the light-shielding layer 21. The color filter 22 includes a red color filter, a green color filter, a blue color filter, etc. The overcoat layer 23 covers the color filter 22. The second alignment film 24 covers the overcoat 23. The liquid crystal layer LC is disposed between the first alignment film 14 and the second alignment film 24. Note that the color filter 22 may also be disposed on the first substrate SUB1.

The display device DSP further includes an illumination device BL (backlight) which is opposed to the first substrate SUB1, a first optical element OD1 which is disposed between the illumination device BL and the first substrate SUB1, and a second optical element OD2 which is disposed between the second substrate SUB2 and the third substrate SUB3. The first optical element OD1 includes a first polarizer PL1, and the second optical element OD2 includes a second polarizer PL2. Each of the first optical element OD1 and the second optical element OD2 may further include other optical elements such as a retardation film and a prism sheet. The illustration device BL, the first optical element OD1 and the second optical element OD2 are opposed to the whole display area DA.

The third substrate SUB3 is attached to the second optical element OD2 via the first adhesive layer AD1. The third substrate SUB3 includes the third basement 30, and the second conductive layer L2 formed on the first surface 30A. The second surface 30B of the third basement 30 corresponds to the outermost surface of the display device DSP. In the example shown in FIG. 3, nothing is provided on the second surface 30B, but an antireflective layer, etc., may be provided on the second surface 30B. In FIG. 3, only the flat second conductive layer L2 is illustrated on the first surface 30A side, but to be more specific, as the layer structure on the first surface 30A side, a structure which will be described later with reference to FIG. 5 can be adopted.

The display device DSP shown in FIG. 3 is an application example of the structure of a transmissive display device which displays an image by selectively transmitting light from the illumination device BL. However, the display device DSP is not limited to this example and may be a reflective display device which displays an image by selectively reflecting light from above the second substrate SUB2 or may also be a transflective display device which has both the function of the transmissive display device and the function of the reflective display device.

Next, the first conductive layer L1, the second conductive layer L2, and the first connecting structure 100 which connects these layers will be described.

FIG. 4 is a plan view showing structural examples of the first conductive layer L1, the second conductive layer L2, and the first contact hole V1 of the first connecting structure 100. The display device DSP includes a plurality of detection electrodes Rx and a plurality of driving electrodes Tx. Each detection electrode Rx and each driving electrode Tx correspond to the second conductive layer L2 provided on the third substrate SUB3. Further, each detection electrode Rx and each driving electrode Tx constitute a sensor which detects an object contacting or approaching the third substrate SUB3 in the display area DA. The detection electrode Rx and the driving electrode Tx may be formed of a transparent conductive material such as ITO or IZO or may be formed of a metal-containing conductive layer. Further, the detection electrode Rx and the driving electrode Tx may have a stacked layer structure or may have a single-layer structure.

The detection electrode Rx includes a detector RS provided in the display area DA, and a terminal RT provided in the surrounding area SA. FIG. 4 shows a case where the terminals RT of the odd-numbered detection electrodes Rx from the flexible printed circuit FPC side are arranged on the left side of the display area DA, and the terminals RT of the even-numbered detection electrodes Rx are arranged on the right side of the display area DA.

The driving electrode Tx includes a transmitter TS arranged in the display area DA, and a terminal TT arranged in the surrounding area SA. In the example shown in FIG. 4, all the terminals TT of the driving electrodes Tx are arranged between the display area DA and the unopposed area NA.

The detectors RS of the detection electrodes Rx extend in the first direction X and are arranged in the second direction Y. The transmitters TS of the driving electrodes Tx extend in the second direction Y and are arranged in the first direction X. In the example illustrated, the detector RS has the shape of a plurality of rectangular portions which are connected to each other. Further, the transmitter TS includes a plurality of rectangular portions arranged in spaces formed between the adjacent detection electrodes Rx. These rectangular portions are electrically connected to each other by bridges BR which are provided across the detectors RS. In the present embodiment, not only the detection electrode Rx and the driving electrode Tx but also the bridge BR correspond to the second conductive layer L2.

FIG. 5 is a diagram showing structural examples of the detector RS, the transmitter TS and the bridge BR and corresponds to a part of the cross-section of the display device DSP taken along line V-V of FIG. 4. The detector RS and the transmitter TS are spaced apart from each other and formed on the first surface 30A of the third basement 30. Between the adjacent transmitters TS, the detector RS is covered with an insulating layer 32. The bridge BR is formed below the insulating layer 32. Both ends of the bridge BR are in contact with the transmitters TS, respectively. The bridge BR and the detector RS are insulated from each other by the insulating layer 32. In this structure, the detection electrode Rx and the driving electrode Tx can be arranged in the same X-Y plane in the state of being electrically insulated from each other.

In the example shown in FIG. 5, the transmitter TS and the bridge BR are covered with the first adhesive layer AD1. The transmitter TS and the bridge BR, and an area of the detector RS which does not overlap the bridge BR may be covered with an insulating layer, and this insulating layer may be in contact with the first adhesive layer AD1.

The first substrate SUB1 includes a pad P1 which is opposed to the terminal RT, and a pad P2 which is opposed to the terminal TT. Further, the first substrate SUB1 includes a wire W1 which connects the pad P1 and the flexible printed circuit FPC to each other, and a wire W2 which connects the pad P2 and the flexible printed circuit FPC to each other. These pads P1 and P2 and wires W1 and W2 correspond to the first conductive layer L1.

The terminal RT and the pad P1 are electrically connected to each other by the first connecting structure 100. The first contact hole V1 of this first connecting structure 100 is formed, for example, in an area where the terminal RT and the pad P1 overlap each other in a plan view. Further, the terminal TT and the pad P2 are also electrically connected to each other by the first connecting structure 100. The first contact hole V1 of this first connecting structure 100 is formed, for example, in an area where the terminal TT and the pad P2 overlap each other in a plan view.

The first substrate SUB1 and the second substrate SUB2 are attached to each other via a sealant SE arranged between these substrates. The sealant SE is formed in the surrounding area SA and surrounds the display area DA. The terminals RT and TT, the pads P1 and P2 and the first contact hole V1 overlap the sealant SE in a plan view.

In the above-described structure, each detection electrode Rx and each driving electrode Tx are electrically connected to the detection circuit RC. The detection circuit RC supplies a drive signal to the driving electrode Tx. As the drive signal is supplied, an electric field is produced between the driving electrode Tx and the detection electrode Rx, and a detection signal is output from the detection electrode Rx. The above-described electric field is influenced by an object such as a user's finger contacting or approaching the third substrate SUB3 in the display area DA. Accordingly, the detection signal varies depending on the presence or absence of the object. The detection circuit RC reads the detection signal from the detection electrode Rx, and detects the presence or absence of the object or the positional coordinates of the object based on the detection signal.

Note that the object detection method by the sensor is not limited to the above-described method. For example, it is possible to apply such a method where the sensor supplies the drive signal to the detection electrodes arranged in the display area DA and reads the detection signals from the electrodes.

FIG. 6 is a sectional view of the display device DSP taken along line VI-VI of FIG. 4. Here, the following description focuses on the first connecting structure 100 which connects the detection electrode Rx, but the first connecting structure 100 which connects the driving electrode Tx also has the same structure. Note that the illumination device BL, the first optical element OD1, the second optical element OD2, etc., are not illustrated.

The first connecting structure 100 shown in the drawing is similar to the structure shown in FIG. 1. That is, the first connecting structure 100 includes the first contact hole V1, the first connecting material C1 and the anisotropic conductive layer AC. Further, the first contact hole V1 includes the hole VA1 which penetrates the second basement 20, the hole VB1 which penetrates the insulating layer IL, the hole VC1 which penetrates the pad P1 (first conductive layer L1), and the recess R1 of the first basement 10. The first portion CP1 of the first contacting material C1 is in contact with the pad P1 in the first contact hole V1. The second portion CP2 of the first connecting material C1 is electrically connected to the terminal RT (second conductive layer L2) via the anisotropic conductive layer AC.

In the example shown in FIG. 6, the insulating layer IL includes the above-described second insulating layer 12, light-shielding layer 21, overcoat layer 23 and sealant SE. The hole VB1 penetrates these second insulating layer 12, light-shielding layer 21, overcoat layer 23 and sealant SE. Note that the insulating layer IL may further include the first alignment film 14, the second alignment film 24, etc., shown in FIG. 3. Further, the insulating layer IL may not include at least one of the second insulating layer 12, the light-shielding layer 21, the overcoat layer 23 and the sealant SE.

The third substrate SUB3 further includes a decorative layer 31 (light-shielding layer or colored layer). The decorative layer 31 is opposed to the surrounding area SA and opens in accordance with the shape of the above-described display area DA. As the decorative layer 31 is provided, the first contact hole V1 cannot be seen from the outside. As the third substrate SUB3 is provided, unevenness resulting from the first contact hole V1 will not show up on the outside of the display device DSP.

FIG. 7 is a sectional view showing a modification of the display device DSP shown in FIG. 6. As shown in the drawing, the second optical element OD2 may be interposed between the second substrate SUB2 and the third substrate SUB3 in the vicinity of the first contact hole V1. In the example illustrated, the first contact hole V1 further includes a hole VPL which penetrates the second optical element OD2.

In the vicinity of the boundary between the hole VA1 and the hole VPL, the width of the hole VPL is greater than the width of the hole VA1. Accordingly, the second basement 20 includes an area A13 (third area) exposed form the second optical element OD2 in the circumference of the hole VA1. For example, the area A13 in a plan view has the shape of a ring which completely surrounds the circumference of the hole VPL. Note that the area A13 may be provided in a part of the circumference of the hole VPL or may be provided intermittently around the circumference of the hole VPL.

The second portion CP2 extends above the second optical element OD2. The first connecting material C1 also covers the area A13. The first adhesive layer AD1 covers the second optical element OD2 and the first connecting material C1.

Figure 8:
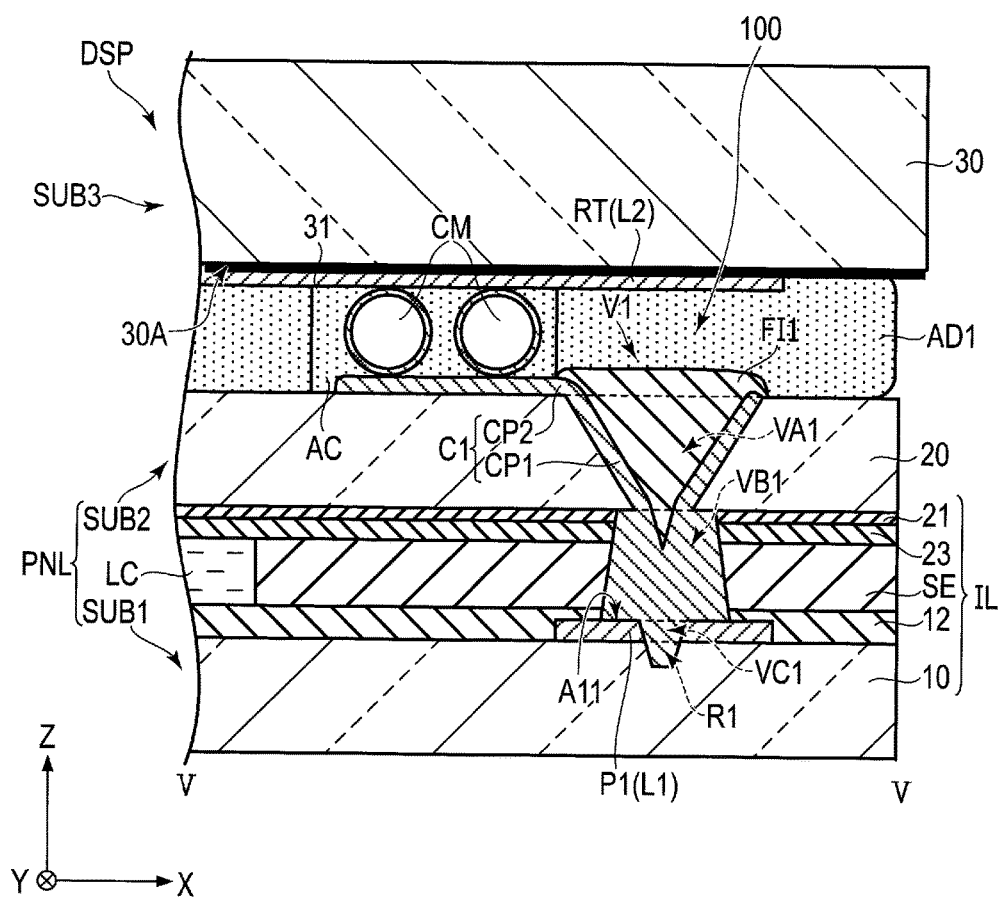
FIG. 8 is a sectional view showing another modification of the display device shown in FIG. 6.

FIG. 8 is a sectional view showing another modification of the display device DSP shown in FIG. 6. As shown in the drawing, the first connecting structure 100 may further include a first filling material FI1 which fills the hollow of the first connecting material C1. The first filling material FI1 may be formed of, for example, an insulating resin material. The first filling material FI1 may be conductive. In the example shown in FIG. 8, the first filling material FI1 projects from the hole VA1, but the filling material FI1 may not project from the hole VA1. As the first filing material FI1 is provided, steps resulting from the first contact hole V1 can be suppressed or prevented.

According to the application example described above with reference to FIGS. 2 to 8, the detection electrode Rx and the driving electrode Tx can be electrically connected to the flexible printed circuit FPC by the first connecting structure 100. Therefore, the sensor including the detection electrode Rx and the driving electrode Tx can be driven via the flexible printed circuit FPC mounted on the first substrate SUB1. In addition, various favorable effects described with reference to FIG. 1, etc., can be produced from the present application example.

The second conductive layer L2 is not limited to the detection electrode Rx and the driving electrode Tx and may be a conductive layer having another function.

Second Embodiment

A second embodiment will be described. Elements the same as or similar to those of the first embodiment are denoted by the same reference numbers, and explanations thereof are omitted unless necessary.

Figure 9:
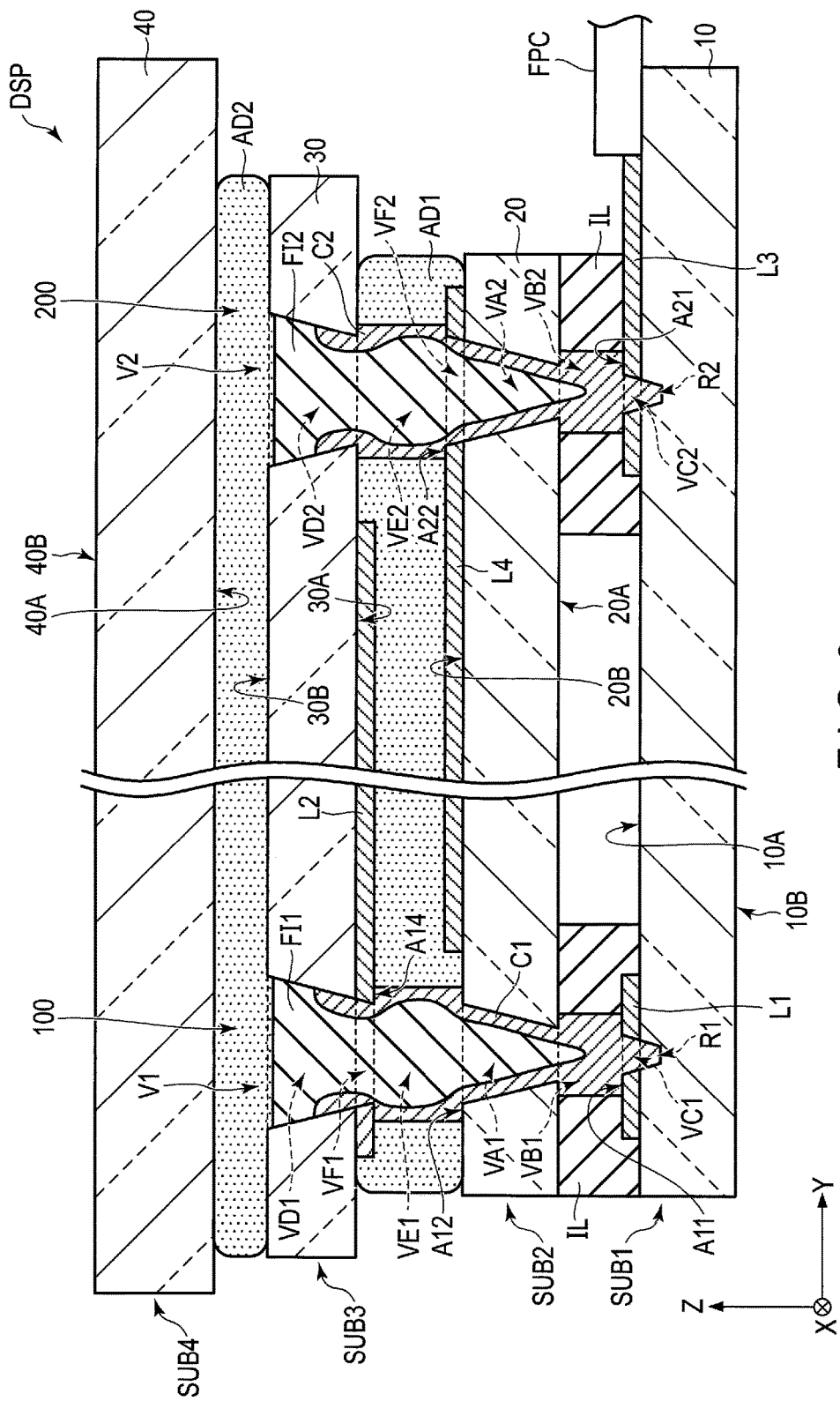
FIG. 9 is a sectional view showing a structural example of a display device of a second embodiment.

FIG. 9 is a sectional view showing a structural example of the display device DSP of the second embodiment. In the display device DSP shown in the drawing, the first substrate SUB1 includes a third conductive layer L3 in addition to the first conductive layer L1, and the second substrate SUB2 includes a fourth conductive layer L4. Further, the display device DSP includes the first connecting structure 100 which connects the first conductive layer L1 and the second conductive layer L2 to each other, and a second connecting structure 200 which connects the third conductive layer L3 and the fourth conductive layer L4 to each other. Still further, the display device DSP includes a fourth substrate SUB4 which is opposed to the third substrate SUB3, and a second adhesive layer AD2 which is formed between the third substrate SUB3 and the fourth substrate SUB4.

The third conductive layer L3 is connected to the flexible printed circuit FPC. In the cross-section shown in the drawing, the first conductive layer L1 and the flexible printed circuit FPC are spaced apart from each other, but the first conductive layer L1 is routed in a position other than this section and is connected to the flexible printed circuit FPC. For example, the first conductive layer L1 and the third conductive layer L3 are formed on the first surface 10A and are covered with the insulating layer IL. Note that various insulating layers and various conductive layers may be disposed between the first basement 10 and the first conductive layer L1 and between the first basement 10 and the third conductive layer L3. Further, for example, the fourth conductive layer L4 is formed on the second surface 20B and is covered with the first adhesive layer AD1. Note that various insulating layers and various conductive layers may be disposed between the second basement 20 and the fourth conductive layer L4. Further, the fourth conductive layer L4 may be covered with an insulating layer other than the first adhesive layer AD1, the first adhesive layer AD1 may be formed above this insulating layer.

As in the case of the example shown in FIG. 1, the first connecting structure 100 in the present embodiment includes the first contact hole V1 and the first connecting material C1. The first contact hole V1 includes the hole VA1 which penetrates the second basement 20, the hole VB1 which penetrates the insulating layer IL, the hole VC1 which penetrates the first conductive layer L1, and the recess R1 which is formed on the first surface 10A. The first contact hole V1 further includes a hole VD1 which penetrates the third basement 30, a hole VE1 which penetrates the first adhesive layer AD1, and a hole VF1 which penetrates the second conductive layer L2.

The centers of the holes VA1, VB1, VC1, VD1, VE1 and VF1 and the recess R1 are located on the same straight line which extends in the third direction Z, and the holes VA1, VB1, VC1, VD1, VE1 and VF1 and the recess R1 communicate with each other. Each of the holes VA1, VB1, VC1, VD1, VE1 and VF1 and the recess R1 is, for example, a perfect circle in a plan view but may be an ellipse or in various other shapes.

In the circumference of the hole VC1, the area A11 similar to that of the example shown in FIG. 1 is formed.

In the vicinity of the boundary between the hole VE1 and the hole VA1, the width of the hole VE1 is greater than the width of the hole VA1. Accordingly, the second basement 20 includes an area A12 (second area) exposed form the first adhesive layer AD1 in the circumference of the hole VA1. For example, the area A12 in a plan view has the shape of a ring which completely surrounds the circumference of the hole VA1. Note that the area A12 may be provided in a part of the circumference of the hole VA1 or may be provided intermittently around the circumference of the hole VA1.

In the vicinity of the boundary between the hole VE1 and the hole VF1, the width of the hole VE1 is greater than the width of the hole VF1. Accordingly, the second conductive layer L2 includes an area A14 (fourth area) exposed from the first adhesive layer AD1 in the circumference of the hole VE1. For example, the area A14 in a plan view has the shape of a ring which completely surrounds the circumference of the hole VF1. Note that the area A14 may be provided in a part of the circumference of the hole VF1 or may be provided intermittently around the circumference of the hole VF1.

The first connecting material C1 covers the inner surfaces of the holes VA1, VB1, VC1, VD1, VE1 and VF1, the areas A11, A12 and A14, and the inside of the recess R1. That is, the first connecting material C1 is in contact with the first conductive layer L1 and the second conductive layer L2 and electrically connects these conductive layers to each other. Since the first connecting material C1 covers not only the inner surface of the first conductive layer L1 but also the area A11, and covers not only the inner surface of the second conductive layer L2 but also the area A14, the contact areas between the first connecting material C1 and these conductive layers can be increased, and consequently the reliability of electrical continuity improves.

The first connecting structure 100 includes the first filling material FI1 which fills the hollow of the first connecting material C1. In the example shown in FIG. 9, the first filling material FI1 does not project from the hole VD1, but the filling material FI1 may project from the hole VD1.

The second connecting structure 200 includes a second contact hole V2 and a second connecting material C2. The second contact hole V2 includes a hole VA2 which penetrates the second basement 20, a hole VB2 which penetrates the insulating layer IL, a hole VC2 which penetrates the first conductive layer L1, a hole VD2 which penetrates the third basement 30, a hole VE2 which penetrates the first adhesive layer AD1, a hole VF2 which penetrates the fourth conductive layer L4, and a recess R2 which is formed on the first surface 10A.

The centers of the holes VA2, VB2, VC2, VD2, VE2 and VF2 and the recess R2 are located on the same straight line which extends in the third direction Z, and the holes VA2, VB2, VC2, VD2, VE2 and VF2 and the recess R2 communicate with each other. Each of the holes VA2, VB2, VC2, VD2, VE2 and VF2 and the recess R2 is, for example, a perfect circle in a plan view but may be an ellipse or in various other shapes.

The shapes of the holes VA2, VB2, VC2, VD2, VE2 and VF2 and the recess R2 are similar to the shapes of the holes VAL VB1, VC1, VD1, VE1 and VF1 and the recess R1 of the first contact hole V1. Further, an area A21 similar to the area A11 is formed on the upper surface of the third conductive layer L3. Further, the fourth conductive layer L4 includes an area A22 exposed from the first adhesive layer AD1 in the circumference of the hole VF2.

The second connecting material C2 covers the inner surfaces of the holes VA2, VB2, VC2, VD2, VE2 and VF2, the areas A21 and A22, and the inside of the recess R2. That is, the second connecting material C2 is in contact with the third conductive layer L3 and the fourth conductive layer L4 and electrically connects these conductive layers to each other. Since the second connecting material C2 covers not only the inner surface of the third conductive layer L3 but also the area A21, and covers not only the inner surface of the fourth conductive layer L4 but also the area A22, the contact areas between the second connecting material C2 and these conductive layers can be increased, and consequently the reliability of electrical continuity improves.

The second connecting structure 200 includes a second filling material FI2 which fills a follow of the second connecting material C2. In the example shown in FIG. 9, the second filling material FI2 does not project from the hole VD2, but the second filing material FI2 may project from the hole VD2. The second connecting material C2 and the second filling material FI2 can be formed of the same materials as those of the first connecting material C1 and the first filling material FI1, respectively.

In the example shown in FIG. 9, the holes VA1, VA2, VC1, VC2, VD1, VD2, VF1 and VF2 have such a tapered shape that the width (inner diameter) decreases toward the lower end. The holes VB1, VB2, VE1 and VE2 have a constant width (inner surface parallel to the third direction Z). The shape of these holes constituting the first contact hole V1 and the second contact hole V2 is not limited to the example shown in FIG. 9 and may be any of a tapered shape that the width gradually decreases toward the lower end, a tapered shape that the width gradually increases toward the lower end, and a shape that the width is constant. Further, the inner surfaces of these holes in a sectional view may be linear or may be curved.

The fourth substrate SUB4 includes a fourth basement 40. In the present embodiment, the fourth basement 40 is, for example, a glass substrate formed of alkali-free glass, etc. The fourth basement 40 may also be a resin substrate formed of polyimide, etc. The fourth basement 40 has a first surface 40A which is opposed to the third substrate SUB3, and a second surface 40B which is opposite to the first surface 40A. The second surface 40B corresponds to the outermost surface of the display device DSP. In the example shown in FIG. 9, nothing is provided on the second surface 40B, but an antireflective layer, etc., may be provided on the second surface 40B. The fourth basement 40 is attached to the third basement SUB3 via the second adhesive layer AD2. Since the fourth basement SUB4 is provided, unevenness resulting from the first contact hole V1 and the second contact hole V2 will not show up on the outside of the display device DSP.

Note that the display device DSP may not include the fourth substrate SUB4. In that case, the second surface 30B of the third basement 30 corresponds to the outermost surface of the display device DSP.

According to the above-described structure, it is possible to electrical connect the second conductive layer L2 and the flexible printed circuit FPC to each other by the first connecting structure 100 and electrically connect the fourth conductive layer L4 and the flexible printed circuit FPC to each other by the second connecting structure 200. Therefore, control circuits which write signals to the second conductive layer L2 and the fourth conductive layer L4 or read signals output from the second conductive layer L2 and the fourth conductive layer L4 can be connected to the second conductive layer L2 and the fourth conductive layer L4 via the flexible printed circuit FPC. That is, to connect the second conductive layer L2 and the fourth conductive layer L4 to the control circuits, there is no need to mount other circuit boards on the substrate SUB3 and the second substrate SUB2.

Further, neither terminals for mounting these circuit boards nor routing wires for connecting the second conductive layer L2 and the fourth conductive layer L4 to these circuit boards will be required. Accordingly, the costs and spaces for the circuit board, terminal and routing wire which are considered unnecessary can be reduced in the present embodiment.

Next, an example of a liquid crystal display device adopting the structure shown in FIG. 9 will be described.

FIG. 10 is a plan view showing a structural example of the display device DSP. The display device DSP includes the display panel PNL including the first substrate SUB1 and the second substrate SUB2, the third substrate SUB3, the fourth substrate SUB4, the flexible printed circuit FPC, and the IC chip I1. Here, the fourth substrate SUB4 is shown by dashed lines, the third substrate SUB3 is only partially illustrated. The first substrate SUB1 is an array substrate, and the second substrate SUB2 is a counter-substrate opposed to the array substrate. The third substrate SUB3 is an illumination device (front light) which supplies display light to the display panel PNL. The fourth substrate SUB4 is a cover member which constitutes the outermost surface of the display device DSP. The basic structure of the display panel PNL is similar to the structures shown in FIGS. 2 and 4. However, in the present embodiment, the display panel PNL is a reflective display panel which displays an image using light from the third substrate SUB3.

The IC chip I1 includes a drive circuit LD which controls the third basement SUB3, in addition to the display driver DD and the detection circuit RC. Note that the drive circuit LD may be incorporated in an IC chip other than the IC chip I1.

The third substrate SUB3 includes a plurality of light emitting elements LS. In the example shown in FIG. 10, the light emitting elements LS are arranged in the display area DA in a matrix in the first direction X and the second direction Y. The arrangement of the light emitting elements LS is not limited to this, and for example, the light emitting elements LS may be arranged in such a manner as to linearly extend in the first direction X or the second direction Y or may also be arranged in various other manners.

Each light emitting element LS is electrically connected to an anode AN (first electrode) and a cathode CA (second electrode). Each light emitting element LS includes a light emitting layer which emits light by a voltage between the anode AN and the cathode CA. For example, an organic electroluminescent layer containing an organic compound may be used as the light emitting layer. The anode AN and the cathode CA are formed of, for example, a transparent conductive material such as ITO or a metal-containing conductive layer.

The anode AN is connected to a terminal AT. Further, the cathode CA is connected to a terminal CT. In this application example, the anode AN, the cathode CA and the terminals AT and CT correspond to the second conductive layer L2.

The first substrate SUB1 includes a pad P3 which is opposed to the terminal AT of the anode AN, and a pad P4 which is opposite to the terminal CT of the cathode CA. Further, the first substrate SUB1 includes a wire W3 which connects the pad P3 and the flexible printed circuit FPC to each other, and a wire W4 which connects the pad P4 and the flexible printed circuit FPC to each other. In this application example, the pads P3 and P4 and the wires W3 and W4 correspond to the first conductive layer L1.

The terminal AT and the pad P3 are electrically connected to each other by the first connecting structure 100. The first contact hole V1 of this first connecting structure 100 is formed, for example, in an area where the terminal AT and the pad P3 overlap each other in a plan view. Further, the terminal CT and the pad P4 are also electrically connected to each other by the first connecting structure 100. The first contact hole V1 of this first connecting structure 100 is formed, for example, in an area where the terminal CT and the pad P4 overlap each other in a plan view. The terminals AT and CT, the pads P3 and P4 and the first contact hole V1 overlap the sealant SE in a plan view.

On the other hand, the second substrate SUB2 includes the detection electrodes Rx, the driving electrodes Tx and the bridges BR. These detection electrodes Rx, driving electrodes Tx and bridges BR are arranged on a different substrate from that of the example shown in FIG. 4, but have the same structures as those of the example shown in FIG. 4. In this application example, each detection electrode Rx, each driving electrode Tx and each bridge BR correspond to the third conductive layer L3 provided on the second substrate SUB2. Further, each detection electrode Rx and each driving electrode Tx constitute a sensor which detects an object contacting or approaching the fourth substrate SUB4 in the display area DA.

The first substrate SUB1 includes the pad P1 which is opposed to the terminal RT of the detection electrode Rx, and the pad P2 which is opposed to the terminal TT of the driving electrode Tx. Further, the first substrate SUB1 includes the wire W1 which connects the pad P1 and the flexible printed circuit FPC to each other, and the wire W2 which connects the pad P2 and the flexible printed circuit FPC to each other. In this application example, the pads P1 and P2 and the wires W1 and W2 correspond to the third conductive layer L3.

The terminal RT and the pad P1 are electrically connected to each other by the second connecting structure 200. The second contact hole V2 of this second connecting structure 200 is formed, for example, in an area where the terminal RT and the pad P1 overlap each other in a plan view. Further, the terminal TT and the pad P2 are also electrically connected to each other by the second connecting structure 200. The second contact hole V2 of this second connecting structure 200 is formed, for example, in an area where the terminal TT and the pad P2 overlap each other in a plan view. The terminals RT and TT, the pads P1 and P2 and the first contact hole V1 overlap the sealant SE in a plan view.

In the above-described structure, each detection electrode Rx and each driving electrode Tx are electrically connected to the detection circuit RC. Further, the anode AN and the cathode CA are electrically connected to the drive circuit LD. For example, the drive circuit LD can make the light emitting element LS emit light at desired intensity by controlling the amount or frequency of the voltage supplied to the anode AN and the cathode CA. The anode AN or the cathode CA may be divided into a plurality of electrically-insulated sections, and each section may be connected to the drive circuit LD by the first connecting structure 100. In that case, it is possible, by changing the voltage from one section to another section, to change the intensity of illumination from one area corresponding to one section to another area corresponding to another section.

Note that the structure of the sensor is not limited to the example shown in FIG. 10. FIG. 11 shows another structural example of the sensor. In the example illustrated, the detection electrodes Rx extend in the first direction X in a strip-like manner and are arranged in the second direction Y in the display area DA. The driving electrodes Tx extend in the second direction Y in a strip-like manner and are arranged in the first direction X in the display area DA. Note that the detection electrodes Rx may extend in the second direction Y and be arranged in the first direction X, and that the driving electrodes Tx may extend in the first direction X and be arranged in the second direction Y. The detection electrode Rx may be formed of a transparent material such as ITO or may be formed of a metal-containing conductive thin wire.

Each detection electrode Rx and each driving electrode Tx are spaced apart from each other and opposed to each other in the third direction Z. For example, the common electrode CE can be used as the driving electrode Tx. In this case, the same electrode is used as one of the pair of electrodes for sensing and also as one of the pair of electrodes for display, and therefore the structure of the display device DSP can be simplified. Further, if the common electrode CE is provided on the first substrate SUB1 as in the case of the example shown in FIG. 3, the second connecting structure 200 for the drive electrode Tx can be omitted.

Figure 12:
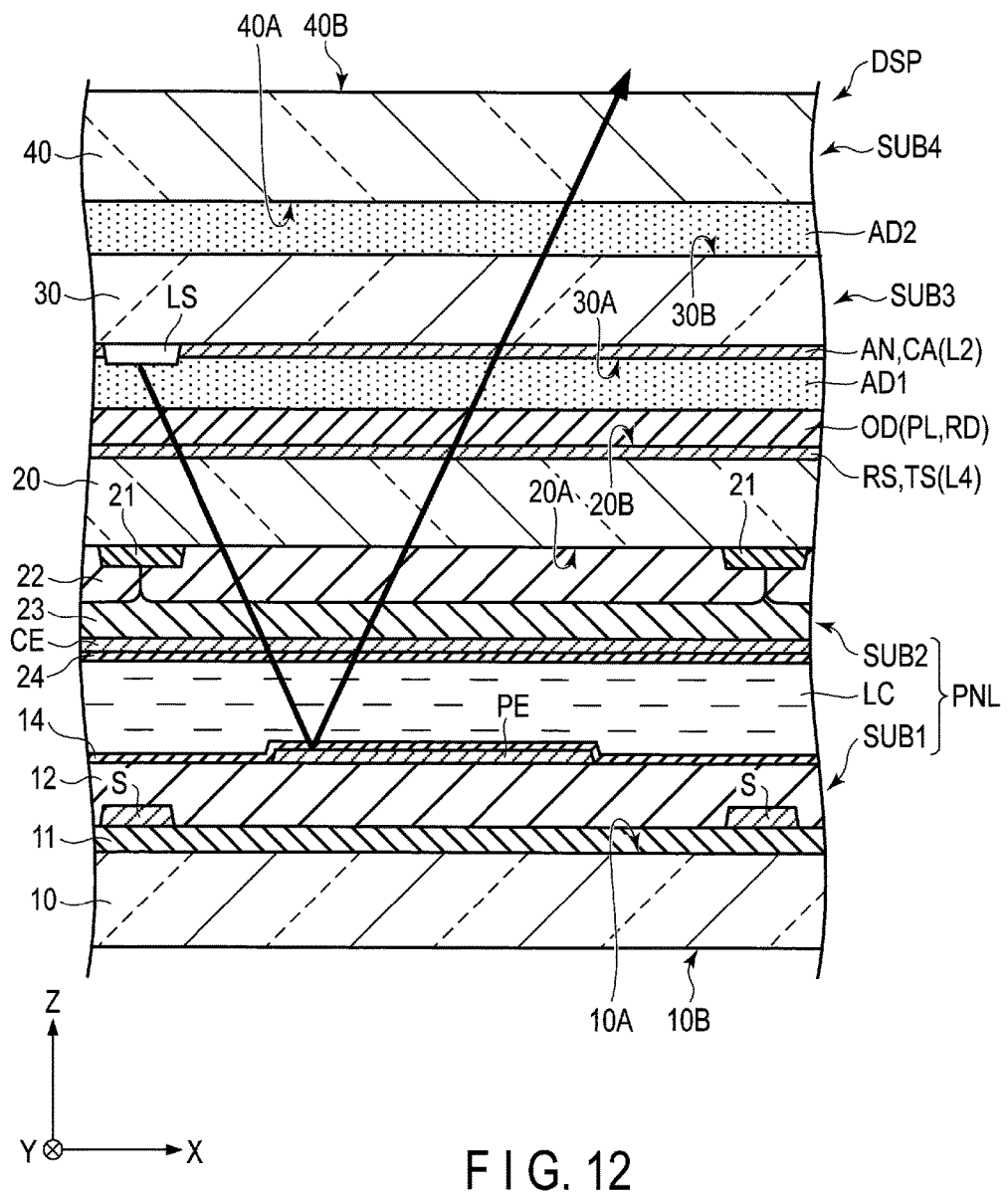
FIG. 12 is a sectional view schematically showing a display area of the display device shown in FIG. 10.

FIG. 12 is a sectional view schematically showing the structure of the display device DSP shown in FIG. 10 in the display area DA. The display panel PNL shown in the drawing differs from the example shown in FIG. 3 in that the common electrode CE is provided on the second substrate SUB2. The common electrode CE is disposed between the overcoat layer 23 and the second alignment film 24. On the other hand, the pixel electrode PE is disposed between the second insulating layer 12 and the first alignment film 14. Further, the display device DSP includes an optical element OD disposed between the second substrate SUB2 and the third substrate SUB3. For example, the optical element OD includes a polarizer PL and a retardation film RD. The optical element OD may further include a diffuser, etc.

The fourth conductive layer L4 including the detector RS of the detection electrode Rx and the transmitter TS of the driving electrode Tx is formed on the second surface 20B of the second basement 20 and is covered with the optical element OD. The third substrate SUB3 is attached to the optical element OD via the first adhesive layer AD1.

The second conductive layer L2 including the anode AN and the cathode CA is formed on the first surface 30A. The light emitting element LS is also formed on the first surface 30A and is connected to the anode AN and the cathode CA. The anode AN and the cathode CA are collectively illustrated as one layer in FIG. 12, but in reality, the anode AN and the cathode CA are spaced apart from each other by an insulating layer.

The light emitting element LS emits light downward in the drawing. The pixel electrode PE is formed of a material having metallic luster such as aluminum or silver and reflects light from the light emitting element LS. The light reflected by the pixel electrode PE is transmitted through an area where the light emitting element LS is not provided, and is output from the fourth basement 40.

As described above, in the example shown in FIG. 12, the pixel electrode PE also functions as a reflective layer which reflects light from the light emitting element LS toward the liquid crystal layer LC. As another example, a reflective layer other than the pixel electrode PE may be provided on the first substrate SUB1.

FIG. 13 is a sectional view of the display device DSP in the vicinity of the first connecting structure 100 and the second connecting structure 200 shown in FIG. 10. Here, the following description focuses on the first connecting structure 100 which connects the anode AN and the second connecting structure 200 which connects the detection electrode Rx, but the first connecting structure 100 which connects the cathode CA and the second connecting structure 200 which connects the driving electrode Tx have the same structures.

The first connecting structure 100 and the second connecting structure 200 shown in this drawing are the same as those shown in FIG. 9. That is, the first connecting structure 100 includes the first contact hole V1, the first connecting material C1 and the first filling material FI1, and the second connecting structure 200 includes the second contact hole V2, the second connecting material C2 and the second filling material FI2. The first contact hole V1 includes the holes VA1, VB1, VC1, VD1, VE1 and VF1 and the recess R1. The first connecting material C1 in the first contact hole V1 is in contact with the pad P3 (first conductive layer L1) and the terminal AT of the anode AN (second conductive layer L2). The second contact hole V2 includes the holes VA2, VB2, VC2, VD2, VE2 and VF2 and the recess R2. In the second contact hole V2, the second connecting material C2 is in contact with the pad P1 (third conductive layer L3) and the detector RS of the detection electrode Rx (fourth conductive layer L4).

In the example shown in FIG. 13, the insulating layer IL includes the above-described second insulating layer 12, light-shielding layer 21, overcoat layer 23 and sealant SE. The holes VB1 and VB2 penetrate these second insulating layer 12, light-shielding layer 21, overcoat layer 23 and sealant SE. Note that the insulating layer IL may further include the first alignment film 14, the second alignment film 24, etc., shown in FIG. 12. Further, the insulating layer IL may not include at least one of the second insulating layer 12, the light-shielding layer 21, the overcoat layer 23 and the sealant SE.

The fourth substrate SUB4 further includes a decorative layer 41 (light-shielding layer or colored layer). The decorative layer 41 is opposed to the surrounding area SA and opens in accordance with the shape of the above-described display area DA. As the decorative layer 41 is provided, the first contact hole V1 and the second contact hole V2 cannot be seen from the outside.

As in the case of the example shown in FIG. 7, an optical element OD may be interposed between the second substrate SUB2 and the third substrate SUB3 in the vicinity of the first contact hole V1 and the second contact hole V2. In this case, each of the first contact hole V1 and the second contact hole V2 has a hole which penetrates the optical element OD. Further, similarly to the area A13 shown in FIG. 7, the second basement 20 may include an area exposed from the optical element OD in the circumference of each of these holes V1 and VA2.

In the application example described with reference to FIGS. 10 to 13, the anode AN and the cathode CA on the third substrate SUB3 can be electrically connected to the flexible printed circuit FPC mounted on the first substrate SUB1 by the first connecting structure 100. Further, the detection electrode Rx and the driving electrode Tx for the sensor can be electrically connected to the flexible circuit board FPC by the second connecting structure 200. Therefore, the light emitting element LS on the third substrate SUB3, and the sensor including the detection electrode Rx and the driving electrode Tx on the second substrate SUB2 can be driven via the flexible printed circuit FPC mounted on the first substrate SUB1. In addition, various favorable effects described with reference to FIG. 9, etc., can be produced from the present application example.

Note that the second conductive layer L2 is not limited to the anode AN and the cathode CD of the illumination device and may be a conductive layer having another function. Similarly, the fourth conductive layer L4 is not limited to the detection electrode Rx and the driving electrode Tx of the sensor and may be a conductive layer having another function.

Next, an example of the manufacturing method of the display device DSP shown in FIG. 9 will be described with reference to FIGS. 14 to 17.

Figure 14:
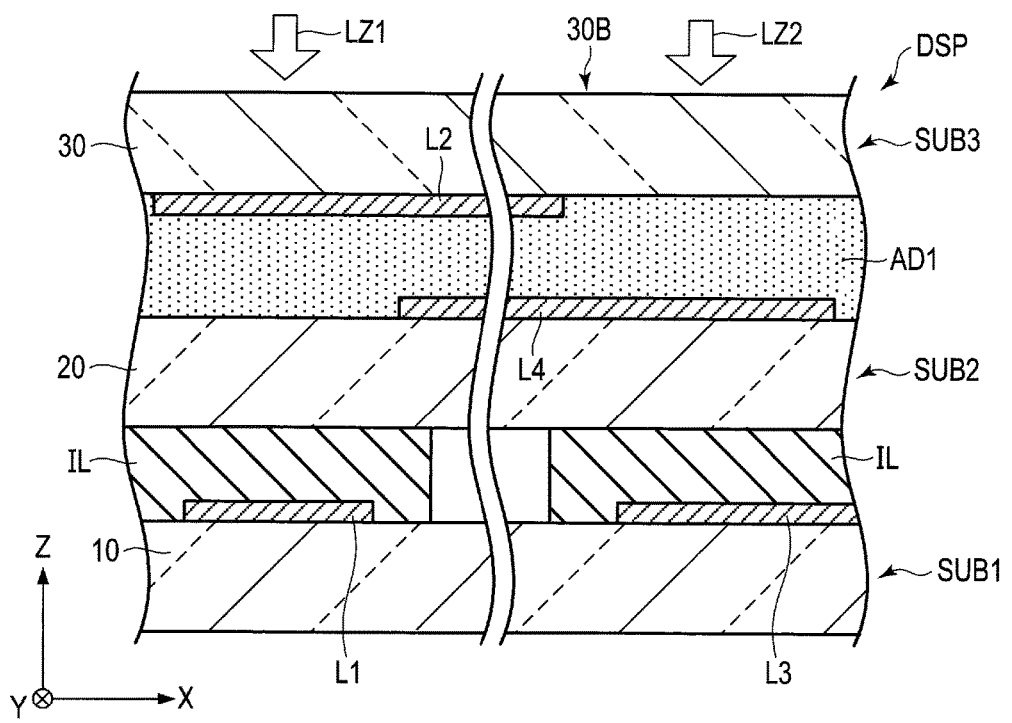
FIG. 14 is a section view showing an example of a manufacturing method of the display device.

Firstly, as shown in FIG. 14, the display device DSP where the first substrate SUB1 and the second substrate SUB2 are attached to each other and the third substrate SUB3 is further attached to the second substrate SUB2 via the first adhesive layer AD1 is prepared. In this state, laser light LZ1 and LZ2 is applied from the second surface 30B. The laser light LZ1 is applied to an area where the first conductive layer L1 and the second conductive layer L2 are opposed to each other, and the laser light LZ2 is applied to an area where the third conductive layer L3 and the fourth conductive layer L4 are opposed to each other. As the laser light source, for example, a carbon dioxide gas laser device, etc., may be adopted, but any laser device is adoptable as long as the laser device can drill a glass material and a resin material, and an excimer laser device, etc., is also adoptable.

As the laser light LZ1 and LZ2 is applied, the first contact hole V1 and the second contact hole V2 are formed as shown in FIG. 15. In general, the melting points of the materials constituting the insulating layer IL and the first adhesive layer AD1 are lower than the melting points of ITO and the metal material constituting the basements 20 and 30 and the fourth conductive layer L4. Therefore, when the laser light LZ1 and LZ2 is applied, the insulating layer IL and the first adhesive layer AD1 melt or sublimate more easily than the basements 20 and 30 and the fourth conductive layer L4. Therefore, in the case of forming the first contact hole V1 and the second contact hole V2 using the laser light LZ1 and LZ2, the above-described areas A11, A12, A14, A21 and A22 are concurrently formed as shown in FIG. 15.

Subsequently, as shown in FIG. 16, for example, under a vacuum environment, the first connecting material C1 mixed with the solvent is injected into the first contact hole V1, and the first contact hole V1 is filled with the first connecting material C1. Similarly, the second connecting material C2 mixed with the solvent is injected into the second contact hole V2, and the second contact hole V2 is filled with the second connecting material C2. After that, the solvents are removed (dried), and the volumes of the first connecting material C1 and the second connecting material C2 are reduced. In this way, the first connecting material C1 attached to the inner surface of the first contact hole V1, and the second connecting material C2 attached to the inner surface of the second contact hole V2 can be formed as shown in FIG. 17.

Further, the hollow of the first contact hole V1 is filled with the first filling material FI1, and the follow of the second contact hole V2 is filled with the second filling material FI2. In this way, the first connecting structure 100 and the second connecting structure 200 shown in FIG. 9 are produced. After that, as the fourth substrate SUB4 is attached to the third substrate SUB3 via the second adhesive layer AD2, the display device DSP shown in FIG. 9 can be produced.

According to the above-described manufacturing method, the first contact hole V1 and the second contact hole V2 can be easily formed by the laser light LZ1 and LZ2. Therefore, as compared to the case of individually forming the holes VA1, VB1, VC1, VD1, VE1, VF1, VA2, VB2, VC2, VD2, VE2 and VF2 and the recesses R1 and R2, the number of processes can be significantly reduced.

The first contact hole V1 and the first connecting material C1 disclosed in the first embodiment can be formed by the same method. In this case, the first contact hole V1 may be formed by applying laser light from the second surface 20B before the third substrate SUB3 is attached to the second substrate SUB2.

The method of forming the first contact hole V1 and the second contact hole V2 is not limited to a method using laser light, and etching or various other processes may be appropriately used.

Third Embodiment

A third embodiment will be described. Elements the same as or similar to those of the first embodiment and the second embodiment are denoted by the same reference numbers, and detailed description thereof is omitted unless necessary.

FIG. 18 is a sectional view showing a structural example of the display device DSP of the third embodiment. As in the case of the example shown in FIG. 1, the display device DSP shown in the drawing includes the first substrate SUB1, the second substrate SUB2, the third substrate SUB3, the insulating layer IL, the first adhesive layer AD1, the flexible printed circuit FPC, the first conductive layer L1 provided on the first substrate SUB1, and the second conductive layer L2 provided on the third substrate SUB3.

The first connecting structure 100 includes a relay conductive layer RL, a third contact hole V3 and a third connecting material C3, in addition to the first contact hole V1 and the first connecting material C1. In the example shown in FIG. 18, the relay conductive layer RL is formed on the second surface 20B and is covered with the first adhesive layer AD1. Note that various insulating layers and various conductive layers may be disposed between the second basement 20 and the relay conductive layer RL. Further, the relay conductive layer RL may be covered with an insulating layer other than the first adhesive layer AD1, and the first adhesive layer AD1 may be formed above this insulating layer.

As in the case of the example shown in FIG. 1, the first contact hole V1 includes the hole VA1 which penetrates the second basement 20, the hole VB1 which penetrates the insulating layer IL, the hole VC1 which penetrates the first conductive layer L1, and the recess R1 which is formed on the first surface 10A. Further, the first contact hole V1 includes a hole VG1 which penetrates the relay conductive layer RL. In the circumference of the hole VC1, the area A11 similar to that of the example shown in FIG. 1 is formed.

The first connecting material C1 covers the inner surface of the first contact hole V1 and partially covers the upper surface of the relay conductive layer RL. Since the first connecting material C1 is in contact with the first conductive layer L1 and the relay conductive layer RL, the first conductive layer L1 and the relay conductive layer RL are electrically connected to each other.

The third contact hole V3 includes a hole VA3 which penetrates the third basement 30, a hole VB3 which penetrates the first adhesive layer AD1, a hole VC3 which penetrates the second conductive layer L2, a hole VG3 which penetrates the relay conductive layer RL, and a recess R3 which is formed on the second surface 20B. The centers of the holes VA3, VB3, VC3 and VG3 and the recess R3 are located on the same straight line which extends in the third direction Z, and the holes VA3, VB3, VC3 and VG3 and the recess R3 communicate with each other. Each of the holes VA3, VB3, VC3 and VG3 and the recess R3 is, for example, a perfect circle in a plan view but may be an ellipse or in various other shapes.

In the vicinity of the boundary between the hole VB3 and the hole VC3, the width of the hole VB3 is greater than the width of the hole VC3. Accordingly, the second conductive layer L2 includes an area A31 exposed from the first adhesive layer AD1 in the circumference of the hole VC3. Further, in the vicinity of the boundary between the hole VB3 and the hole VG3, the width of the hole VB3 is greater than the width of the hole VG3. Accordingly, the relay conductive layer RL includes an area A32 exposed from the first adhesive layer AD1 in the circumference of the hole VG3. For example, the areas A31 and A32 in a plan view are ring-shaped and completely surround the circumferences of the holes VC3 and VG3, respectively. The areas A31 and A32 may be provided in parts of the circumferences of the holes VC3 and VG3 or may be provided intermittently around the circumferences of the holes VC3 and VG3.

The third connecting material C3 covers the inner surfaces of the holes VA3, VB3, VC3 and VG3, the areas A31 and A32, and the inner surface of the recess R3. That is, the third connecting material C3 is in contact with the second conductive layer L2 and the relay conductive layer RL and electrically connects these conductive layers to each other. Since the third connecting material C3 covers not only the inner surface of the second conductive layer L2 but also the area A31, and covers not only the inner surface of the relay conductive layer RL but also the area A32, the contact areas between the third connecting material C3 and these conductive layers can be increased, and consequently the reliability of electrical continuity improves.

The first connecting structure 100 includes a third filling material FI3 which fills the hollow of the third connecting material C3. In the example shown in FIG. 18, the third filing material FI3 does not project from the hole VA3. The third connecting material C3 may be formed of the same material as that of the first connecting material C1. The third filling material FI3 may be formed of, for example, an insulating resin material.

In the example shown in FIG. 18, the VA1, VA3, VC1, VC3, VG1 and VG3 have such a tapered shape that the width (inner diameter) decreases toward the lower end. The holes VB1 and VB3 have a constant width (inner surface parallel to the third direction Z). The shape of these holes constituting the first contact hole V1 and the third contact hole V3 is not limited to the example shown in FIG. 18 and may be any of a tapered shape that the width gradually decreases toward the lower end, a tapered shape that the width gradually increases toward the lower end, and a shape that the width is constant. Further, the inner surfaces of these holes in a sectional view may be linear or may be curved.

In the example shown in FIG. 18, the second surface 30B corresponds to the outermost surface of the display device DSP. Note that the above-described fourth substrate SUB4 may be attached to the third substrate SUB3.

According to the above-described structure, the relay conductive layer RL and the first conductive layer L1 are electrically connected to each other by the first connecting material C1, and the relay conductive layer RL and the second conductive layer L2 are electrically connected to each other by the third connecting material C3. Therefore, the second conductive layer L2 and the flexible printed circuit FPC are electrically connected to each other.

Next, an example of a liquid crystal display device adopting the structure shown in FIG. 18 will be described.

FIG. 19 is a plan view showing a structural example of the display device DSP. The display device DSP includes the display panel PNL including the first substrate SUB1 and the second substrate SUB2, the third substrate SUB3, the flexible printed circuit FPC, and the IC chip I1. Here, the third substrate SUB3 is shown by dashed lines. The first substrate SUB1 is an array substrate, and the second substrate SUB2 is a counter-substrate opposed to the array substrate. The third substrate SUB3 is a cover member which constitutes the outermost surface of the display device DSP. The basic structure of the display panel PNL is similar to the structure shown in FIG. 2.

The display panel PNL may be a transmissive display panel having such a cross-section structure as that shown in FIG. 3 or may be a reflective display panel having such a cross-section structure as that shown in FIG. 12. In the example shown in FIG. 19, similarly to FIG. 11, the display device DSP includes the sensor including the detection electrode Rx and the driving electrode Tx. The detection electrode Rx includes the detector RS and the terminal RT formed on the second surface 20B.

The third substrate SUB3 includes a sensor electrode Sx in the surrounding area SA. In this application example, the sensor electrode Sx corresponds to the second conductive layer L2. In the example shown in FIG. 19, the sensor electrode Sx is arranged between the display area DA and the unopposed area NA. Note that the arrangement position of the sensor electrode Sx is not limited to this example and may be arranged in another position of the surrounding area SA.

For example, the sensor electrode Sx may form a capacitive button which executes a specific operation according to a user's operation and may be called an icon sensor or an icon button in some cases. The specific operation includes, for example, an operation to display a menu screen image on the display area DA, an operation to display a home screen image (or a standby screen image) on the display area DA, an operation to return the screen image of the display area DA to the previously-displayed screen image, and the like. Note that the display device DSP may include a plurality of sensor electrodes Sx assigned with different operations.

The relay conductive layer RL is provided on the same layer together with the detection electrode Rx on the second substrate SUB2. As in the case of the sensor electrode Sx, the relay conductive layer RL is disposed between the display area DA and the unopposed area NA. The first substrate SUB1 includes the pad P4 which is disposed between the display area DA and the unopposed area NA, and the wire W4 which connects the pad P4 and the flexible printed circuit FPC to each other. In this application example, the pad P4 and the wire W4 correspond to the first conductive layer L1. In a plan view, one end of the relay conductive layer RL overlaps the sensor electrode Sx, and the other end of the relay conductive layer RL overlaps the pad P4.

The first contact hole V1 is formed in an area where the sensor electrode Sx and the relay conductive layer RL overlap each other, and the third contact hole V3 is formed in an area where the relay conductive layer RL and the pad P4 overlap each other. The positions of the first contact hole V1 and the third contact hole V3 are not aligned with each other in a plan view. The first contact hole V1 and the third contact hole V3 overlap the sealant SE in a plan view.

As in the case of the example shown in FIG. 11, the terminal RT of the detection electrode Rx is connected to the flexible printed circuit FPC via the second connecting structure 200 including the second contact hole V2, the pad P1 and the wire W1.

In the above-described structure, the sensor electrode Sx and the detection electrode Rx are electrically connected to the detection circuit RC. The detection circuit RC detects the presence or absence of an object contacting or approaching the display area DA or the positional coordinates of the object as described above by the sensor including the detection electrode Rx and the driving electrode Tx.

Further, the detection circuit RC detects a user's operation with respect to the sensor electrode Sx based on a sensor signal obtained from the sensor electrode Sx. For example, in this detection, the detection electrode Rx which is closest to the sensor electrode Sx can be used. That is, when the detection circuit RC supplies a drive signal to the detection electrode Rx, an electric field is formed between the detection electrode Rx and the sensor electrode Sx, and a sensor signal is output from the sensor electrode Sx. The above-described electric field is influenced by an object contacting or approaching the third substrate SUB3 in the vicinity of the sensor electrode Sx. Therefore, the sensor signal also varies depending on the presence or absence of the object. The detection circuit RC reads the sensor signal from the sensor electrode Sx and detects the operation of the sensor electrode Sx based on the sensor signal.

Note that the detection method by the sensor electrode Sx is not limited to the above-described method. For example, a drive signal may not be supplied to the detection electrode Rx which is closest to the sensor electrode Sx but may be supplied to another electrode provided in the surrounding area SA, and an electric field may be formed between this electrode and the sensor electrode Sx. Further, the detection method by the sensor electrode Sx may also be such a method of supplying a drive signal to the sensor electrode Sx and reading a sensor signal from the sensor electrode Sx.

Figure 20:
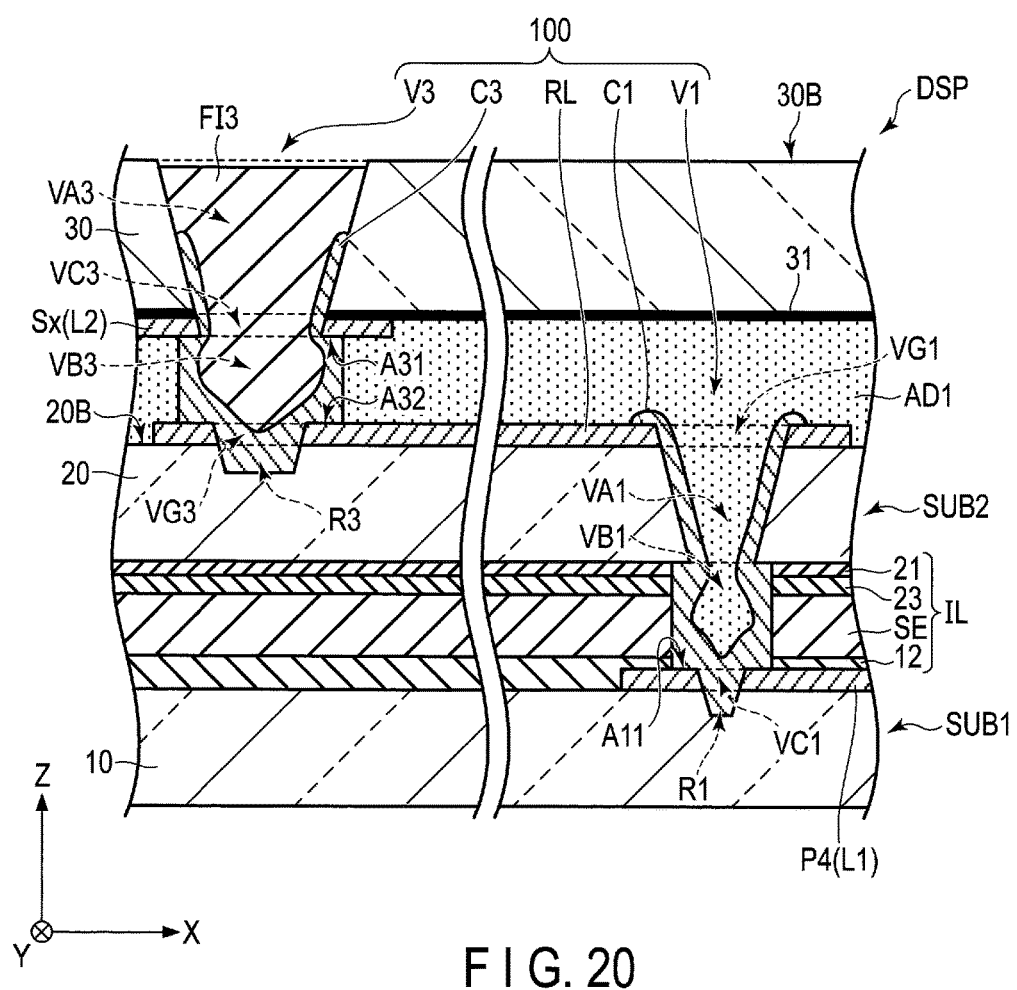
FIG. 20 is a sectional view of the display device in the vicinity of a first connecting structure shown in FIG. 19.

FIG. 20 is a sectional view of the display device DSP in the vicinity of the first connecting structure 100 shown in FIG. 19. The first connecting structure 100 shown in the drawing is similar to that shown in FIG. 18. That is, the first connecting structure 100 includes the first contact hole V1, the first connecting material C1, the relay conductive layer RL, the third contact hole V3, the third connecting material C3, and the third filling material FI3. The first contact hole V1 includes the holes VA1, VB1, VC1 and VG1 and the recess R1. The first connecting material C1 is in contact with the pad P4 (first conductive layer L1) and the relay conductive layer RL via the first contact hole V1. The third contact hole V3 includes the holes VA3, VB3, VC3 and VG3 and the recess R3. The third connecting material C3 is in contact with the sensor electrode Sx (second conductive layer L2) and the relay conductive layer RL via the third contact hole V3.

Although not shown in FIG. 20, the above-described detection electrode Rx is formed on the same layer (for example, the second surface 20B) together with the relay conductive layer RL. As in the case of the detection electrode Rx, the relay conductive layer RL may be formed of a transparent conductive material such as ITO or IZO or may be formed of a metal-containing conductive layer. Further, the relay conductive layer RL may have a stacked layer structure or may have a single-layer structure.

In the example shown in FIG. 20, the insulating layer IL includes the above-described second insulating layer 12, light-shielding layer 21, overcoat layer 23 and sealant SE. The hole VB1 penetrates these second insulating layer 12, light-shielding layer 21, overcoat layer 23 and sealant SE. Note that the insulating layer IL may further includes the first alignment film 14, the second alignment film 24, etc., shown in FIG. 3 or FIG. 12. Further, the insulating layer IL may not include at least one of the second insulating layer 12, the light-shielding layer 21, the overcoat layer 23 and the sealant SE.

The third substrate SUB3 includes the decorative layer 31 as in the case of the example shown in FIG. 6. As the decorative layer 31 is provided, the first contact hole V1 cannot be seen from the outside. The third contact hole V3 penetrates the decorative layer 31. The third filling material FI3 may be colored with the same color as that of the decorative layer 31 such that the third contact hole V3 cannot be seen from the outside.

As in the case of the example shown in FIG. 7, an optical element OD (second optical element OD2) may be interposed between the second substrate SUB2 and the third substrate SUB3 in the vicinity of the first contact hole V1 and the third contact hole V3. In this case, the first contact hole V1 or the third contact hole V3 may include a hole which penetrates the optical element OD.

As in the case of the manufacturing method described in the second embodiment, the first contact hole V1 and the third contact hole V3 can be formed by using laser light. That is, the first contact hole V1 can be formed by applying laser light from the second surface 20B of the second basement 20 before the third substrate SUB3 is attached to the second substrate SUB2. Further, the third contact hole V3 can be formed by applying laser light from the second surface 30B after the third substrate SUB3 is attached to the second substrate SUB2.

The method of forming the first contact hole V1 and the third contact hole V3 is not limited to a method using laser light, and etching or various other processes may be appropriately used.

In the application example described with reference to FIGS. 19 and 20, the sensor electrode Sx on the third substrate SUB3, and the flexible printed circuit FPC mounted on the first substrate SUB1 are electrically connected to each other by the first connecting structure 100. Therefore, the operation with respect to the sensor electrode Sx on the third substrate SUB3 can be detected via the flexible printed circuit FPC mounted on the first substrate SUB1. In addition, various favorable effects which have been described earlier can be produced from the present application example.

The second conductive layer L2 is not limited to the sensor electrode Sx but may be a conductive layer having another function such as the above-described anode AN and cathode CN of the illumination device.

Fourth Embodiment

A fourth embodiment will be described. Elements the same as or similar to those of the first to third embodiments are denoted by the same reference numbers, and detailed description thereof is omitted unless necessary.

The present embodiment discloses the display device DSP including a connecting structure such as that of the second embodiment which connects conductive layers on different substrates to each other by a contact hole penetrating two basements, and a connecting structure such as those of the first and third embodiments which connects conductive layers on different substrates to each other by a contact hole penetrating one basement.

Figure 21:
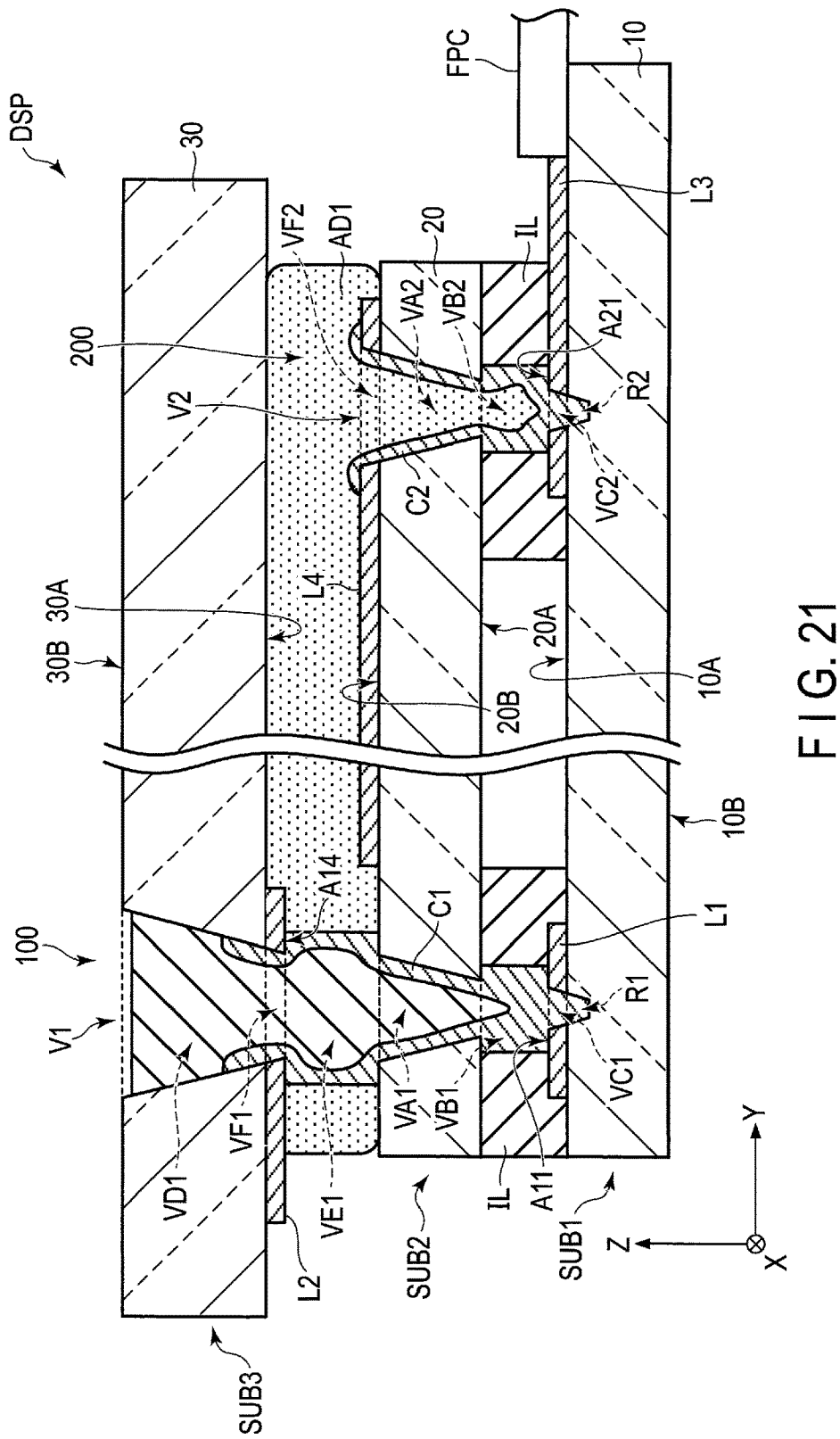
FIG. 21 is a sectional view showing a structural example of a display device of a fourth embodiment.

FIG. 21 is a sectional view showing a structural example of the display device DSP of the fourth embodiment. The display device DSP shown in the drawing includes the first substrate SUB1, the second substrate SUB2, the third substrate SUB3, the insulating layer ILL the first adhesive layer AD1 and the flexible printed circuit FPC. Further, the display device DSP includes the first conductive layer L1 provided on the first substrate SUB1, the second conductive layer L2 provided on the third substrate SUB3, the third conductive layer L3 provided on the first substrate SUB1, and the fourth conductive layer L4 provided on the second substrate SUB2.

The first conductive layer L1 and the second conductive layer L2 are electrically connected to each other by the first connecting structure 100. The third conductive layer L3 and the fourth conductive layer L4 are electrically connected to each other by the second connecting structure 200.

As in the case of the example shown in FIG. 9, the first connecting structure 100 includes the first contact hole V1, the first connection material C1 and the first filling material FI1. The first contact hole V1 includes the hole VA1 which penetrates the second basement 20, the hole VB1 which penetrates the insulating layer IL, the hole VC1 which penetrates the first conductive layer L1, the hole VD1 which penetrates through the third basement 30, the hole VE1 which penetrates the first adhesive layer AD1, the hole VF1 which penetrates the second conductive layer L2, and the recess R1 which is formed on the first surface 10A. Further, the first conductive layer L1 includes the area A11 in the circumference of the hole VC1, and the second conductive layer L2 includes the area A14 in the circumference of the hole VF1.

As in the case of the example shown in FIG. 9, the second connecting structure 200 includes the second contact hole V2 and the second connecting material C2. The second contact hole V2 includes the hole VA2 which penetrates the second basement 20, the hole VB2 which penetrates the insulating layer IL, the hole VC2 which penetrates the third conductive layer L3, the hole VF2 which penetrates the fourth conductive layer L4, and the recess R2 which is formed on the first surface 10A. Further, the third conductive layer L3 includes the area A21 in the circumference of the hole VC2. In the example shown in FIG. 21, the second contact hole V2 does not penetrate the third basement 30 and the first adhesive layer AD1.

The second connecting material C2 covers the inner surfaces of the holes VA2, VB2, VC2 and VF2 and the recess R2. Further, the second connecting material C2 covers the upper surface of the fourth conductive layer L4 in the circumference of the hole VF2. In the example shown in FIG. 21, the hollow of the second connecting material C2 is filled with the first adhesive layer AD1. As in the case of the example shown in FIG. 9, this hollow may also be filled with the second filling material FI2.

The third conductive layer L3 is connected to the flexible printed circuit FPC. In the cross-section shown in FIG. 21, the first conductive layer L1 and the flexible printed circuit FPC are spaced apart from each other, but the first conductive layer L1 is routed in a position different from this section and is connected to the flexible printed circuit FPC.

In the above-described structure also, the second conductive layer L2 on the third substrate SUB3 and the fourth conductive layer L4 on the second substrate SUB2 can be connected to the flexible printed circuit FPC.

For example, the second conductive layer L2 may be the detection electrode Rx and the driving electrode Tx as in the case of the application example of the first embodiment, may be the anode AN and the cathode CA of the illumination device as in the case of the application example of the second embodiment, may be the sensor electrode Sx as in the case of the application example of the third example, or may be a conductive layer having another function. Further, the fourth conductive layer L4 may be the detection electrode Rx and the driving electrode Tx as in the case of the application example of the second embodiment or may be a conductive layer having another function.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In each embodiment, an example where a hollow is formed inside the first connecting material C1 has been described. However, the first connecting material C1 may not have any hollow. Similarly, the second connecting material C2 may not have any hollow.

Each embodiment has been described based on the assumption that the first contact hole V1 includes the recess R1 of the first basement 10. However, the first contact hole V1 may not have this recess R1. Further, the first contact hole V1 may not have the hole VC1 which penetrates the first conductive layer L1. Similarly, the second contact hole V2 may not have the recess R2 of the first basement 10 or the hole VC2 which penetrates the third conductive layer L3.

Further, in each embodiment, an example where the flexible printed circuit PFC is connected to the first substrate SUB1 has been described. However, an external connection member such as the flexible printed circuit FPC may not be connected to the first substrate SUB1 but may be connected to the second substrate SUB2 or the third substrate SUB3.

What is claimed is:

1. A display device comprising:
   a first substrate including a first basement, a first conductive layer and a third conductive layer;
   a second substrate including a second basement and a fourth conductive layer, the second basement including a first surface opposed to the first substrate and a second surface opposite to the first surface;
   a display function layer between the first substrate and the second substrate;
   a third substrate including a third basement and a second conductive layer, the third basement being opposed to the second surface of the second substrate;
   a first connecting structure connecting the first conductive layer and the second conductive layer to each other; and
   a second connecting structure which connects the third conductive layer and the fourth conductive layer to each other, wherein
   the first connecting structure includes:
   a first contact hole which penetrates at least the second basement; and
   a first connecting material which electrically connects the first conductive layer and the second conductive layer to each other via the first contact hole, and
   the second connecting structure includes:
   a second contact hole which penetrates at least the second basement; and
   a second connecting material which electrically connects the third conductive layer and the fourth conductive layer to each other via the second contact hole.

2. The display device of claim 1, further comprising an insulating layer between the first basement and the second basement, wherein
   the first contact hole further penetrates the insulating layer.

3. The display device of claim 2, wherein the insulating layer includes a sealant which attaches the first substrate and the second substrate to each other.

4. The display device of claim 1, wherein the second conductive layer is formed between the second basement and the third basement.

5. The display device of claim 4, wherein
   the first connecting material and the second conductive layer are opposed to each other between the second basement and the third basement,
   the first connecting structure further includes an anisotropic conductive layer which is arranged between the first connecting material and the second conductive layer, and
   the first connecting material and the second conductive layer are electrically connected to each other via the anisotropic conductive layer.

6. The display device of claim 5, further comprising an adhesive layer which attaches the second substrate and the third substrate to each other, wherein
   the anisotropic conductive layer is formed in an area of the adhesive layer where the first connecting material and the second conductive layer are opposed to each other.

7. The display device of claim 1, wherein the first contact hole further penetrates the third basement.

8. The display device of claim 1, wherein the second contact hole further penetrates the third basement.

9. A display device comprising:
   a first substrate including a first basement and a first conductive layer;
   a second substrate including a second basement, the second basement including a first surface opposed to the first substrate and a second surface opposite to the first surface;
   a display function layer between the first substrate and the second substrate;
   a third substrate including a third basement and a second conductive layer, the third basement being opposed to the second surface of the second substrate; and
   a first connecting structure connecting the first conductive layer and the second conductive layer to each other, wherein
   the first connecting structure includes:
   a first contact hole which penetrates at least the second basement;
   a first connecting material which electrically connects the first conductive layer and the second conductive layer to each other via the first contact hole;
   a relay conductive layer which is provided on the second substrate;
   a third contact hole which penetrates at least the third basement; and
   a third connecting material which electrically connects the second conductive layer and the relay conductive layer to each other via the third contact hole, wherein
   the first connecting material electrically connects the relay conductive layer and the first conductive layer to each other.

10. The display device of claim 1, wherein the second conductive layer is provided in a display area of an image, and outputs a signal according to an object which contacts or approaches the display area.

11. The display device of claim 1, wherein the second conductive layer is provided in a surrounding area outside a display area of the image, and outputs a signal according to an object which contacts or approaches the surrounding area.

12. The display device of claim 10, further comprising a detection circuit which is electrically connected to the first conductive layer, and reads a signal which is output from the second conductive layer via the first connecting material and the first conductive layer.

13. A display device comprising:
   a first substrate including a first basement and a first conductive layer;
   a second substrate including a second basement, the second basement including a first surface opposed to the first substrate and a second surface opposite to the first surface;
   a display function layer between the first substrate and the second substrate;

a third substrate including a third basement and a second conductive layer, the third basement being opposed to the second surface of the second substrate; and a first connecting structure connecting the first conductive layer and the second conductive layer to each other, wherein the first connecting structure includes:

a first contact hole which penetrates at least the second basement; and a first connecting material which electrically connects the first conductive layer and the second conductive layer to each other via the first contact hole, the third substrate further includes a light emitting element which emits light toward the first substrate based on a voltage which is supplied via the second conductive layer, wherein the first substrate further includes a reflective layer which reflects light from the light emitting element toward the display function layer.

14. The display device of claim 13, further comprising a drive circuit which is electrically connected to the first conductive layer, and supplies a voltage which makes the light emitting layer emit light, to the second conductive layer via the first conductive layer and the first connecting material.

15. A display device comprising:

a first substrate including a first basement and a first conductive layer;

a second substrate including a second basement, the second basement including a first surface opposed to the first substrate and a second surface opposite to the first surface;

a display function layer between the first substrate and the second substrate;

a third substrate including a third basement and a second conductive layer, the third basement being opposed to the second surface of the second substrate;

a first connecting structure connecting the first conductive layer and the second conductive layer to each other, and an insulating layer between the first basement and the second basement, wherein the first connecting structure includes:

a first contact hole which penetrates at least the second basement; and a first connecting material which electrically connects the first conductive layer and the second conductive layer to each other via the first contact hole, the first contact hole further penetrates the insulating layer the first conductive layer, the first conductive layer includes a first area which is exposed from the insulating layer in a circumference of the first contact hole, and the first connecting material is in contact with the first area.

16. A display device comprising:

a first substrate including a first basement and a first conductive layer;

a second substrate including a second basement, the second basement including a first surface opposed to the first substrate and a second surface opposite to the first surface;

a display function layer between the first substrate and the second substrate;

a third substrate including a third basement and a second conductive layer, the third basement being opposed to the second surface of the second substrate;

a first connecting structure connecting the first conductive layer and the second conductive layer to each other; and an adhesive layer which attaches the second substrate and the third substrate to each other, wherein the first connecting structure includes:

a first contact hole which penetrates at least the second basement; and a first connecting material which electrically connects the first conductive layer and the second conductive layer to each other via the first contact hole;

the second basement includes a second area which is exposed from the adhesive layer in a circumference of the first contact hole, and the first connecting material is in contact with the second area.

17. A display device comprising:

a first substrate including a first basement and a first conductive layer;

a second substrate including a second basement, the second basement including a first surface opposed to the first substrate and a second surface opposite to the first surface;

a display function layer between the first substrate and the second substrate;

a third substrate including a third basement and a second conductive layer, the third basement being opposed to the second surface of the second substrate;

a first connecting structure connecting the first conductive layer and the second conductive layer to each other; and an optical element between the second substrate and the third substrate, wherein the first connecting structure includes:

a first contact hole which penetrates at least the second basement; and a first connecting material which electrically connects the first conductive layer and the second conductive layer to each other via the first contact hole, and the first contact hole penetrates the optical element.

18. The display device of claim 17, wherein the second basement includes a third area which is exposed from the optical element in a circumference of the first contact hole, and the first connecting material is in contact with the third area.

19. A display device comprising:

a first substrate including a first basement and a first conductive layer;

a second substrate including a second basement, the second basement including a first surface opposed to the first substrate and a second surface opposite to the first surface;

a display function layer between the first substrate and the second substrate;

a third substrate including a third basement and a second conductive layer, the third basement being opposed to the second surface of the second substrate;

a first connecting structure connecting the first conductive layer and the second conductive layer to each other; and an adhesive layer which attaches the second substrate and the third substrate to each other, wherein the first connecting structure includes:

a first contact hole which penetrates at least the second basement; and a first connecting material which electrically connects the first conductive layer and the second conductive layer to each other via the first contact hole, the second conductive layer is formed between the second basement and the third basement, the first contact hole further penetrates the second conductive layer, the second conductive layer includes a fourth area which is exposed from the adhesive layer in a circumference of the first contact hole, and the first connecting material is in contact with the fourth area.

* * * * *